United States Patent
Tsuchiaki

(10) Patent No.: US 7,732,875 B2
(45) Date of Patent: Jun. 8, 2010

(54) SEMICONDUCTOR DEVICE FABRICATION METHOD AND SEMICONDUCTOR DEVICE FABRICATED THEREBY

(75) Inventor: Masakatsu Tsuchiaki, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 291 days.

(21) Appl. No.: 11/956,072

(22) Filed: Dec. 13, 2007

(65) Prior Publication Data

US 2008/0203440 A1  Aug. 28, 2008

(30) Foreign Application Priority Data

Feb. 28, 2007  (JP) .............................. 2007-049092

(51) Int. Cl.
    *H01L 29/78* (2006.01)
(52) U.S. Cl. ................ 257/401; 257/766; 257/E29.117
(58) Field of Classification Search ................ 257/401, 257/754, 766, E29.117, E29.12
See application file for complete search history.

(56) References Cited

U.S. PATENT DOCUMENTS

| | | | |
|---|---|---|---|
| 6,271,566 B1 | 8/2001 | Tsuchiaki | |
| 7,319,258 B2 * | 1/2008 | Yang et al. | 257/347 |
| 7,339,213 B2 * | 3/2008 | Maeda et al. | 257/255 |
| 2002/0063292 A1 * | 5/2002 | Armstrong et al. | 257/367 |
| 2004/0075141 A1 * | 4/2004 | Maeda et al. | 257/347 |
| 2006/0246638 A1 * | 11/2006 | Asami et al. | 438/150 |
| 2007/0063306 A1 * | 3/2007 | Doyle et al. | 257/486 |
| 2007/0246781 A1 | 10/2007 | Tsuchiaki | |
| 2008/0093676 A1 * | 4/2008 | Shingu et al. | 257/386 |
| 2009/0302382 A1 * | 12/2009 | Adan et al. | 257/334 |

OTHER PUBLICATIONS

Irie et al.; "In-Plane Mobility Anisotropy and Universality Under Uni-Axial Strains in n- and p- MOS Inversion Layers on (100), (110), and (111) Si", IEDM Technical Digest, pp. 225-228, (2004).

Sung et al.; "High Performance CMOS Bulk Technology Using Direct Silicon Bond (DSB) Mixed Crystal Orientation Substrates"; IEDM Technical Digest, pp. 235-238, (2005).

Tsuchiaki et al.; "Junction Leakage Generation by NiSi Thermal Instability Characterized Using Damage-Free $n^+/p$ Silicon Diodes"; Japanese Journal of Applied Physics, vol. 43, No. 8A, pp. 5166-5173, (2004).

* cited by examiner

*Primary Examiner*—Allan R. Wilson
(74) *Attorney, Agent, or Firm*—Finnegan, Henderson, Farabow, Garrett & Dunner, L.L.P.

(57) ABSTRACT

A method of fabricating a semiconductor device having a pair of shallow silicided source and drain junctions with minimal leakage is disclosed. The semiconductor device typically has a MISFET structure with NiSi regions partially making up the source and drain regions. The fabrication method includes the steps of providing silicon surfaces having Si{110} crystal planes on both sides of this gate electrode and forming a plurality of nickel silicide (NiSi) regions, each having a rectangular planar shape whose shorter sides being equal or less than 0.5 µm in length and running along a Si<100> direction.

11 Claims, 22 Drawing Sheets

<100> Edge : Leak Induced

Si<100> →

<110> Edge : Leak Not Induced

Si<110> →

<100> Edge
: Leak Induced

<110> Edge
: Leak Not Induced

SEMICONDUCTOR DEVICE FABRICATION METHOD AND SEMICONDUCTOR DEVICE FABRICATED THEREBY

CROSS-REFERENCE TO RELATED APPLICATION

This application is based upon and claims the benefit of priority from the Japanese Patent Application No. 2007-049092, filed on Feb. 28, 2007, the entire content of which is incorporated herein by reference.

FIELD OF THE INVENTION

The present invention relates generally to semiconductor device technologies and, more particularly, to ultralarge-scale integrated (ULSI) semiconductor devices having highly miniaturized high-speed field effect transistors (FETs) with silicided source and drain electrodes. This invention also relates to fabrication methodology of the semiconductor devices.

BACKGROUND OF THE INVENTION

The advent of ultrahigh-speed/high-functionality semiconductor devices had spurred rapid evolution of an information-consuming and knowledge-intensive society into a global web of high-speed communication networks, as exemplified by the ubiquitous presence of radiofrequency cellular or "mobile" phones in daily activities. Naturally, the world-wide spread of such a social transformation as well as an insatiable quest for more efficient and convenient lifestyles further demands yet higher-speed operation of ever-shrinking semiconductor devices integrated on a much larger scale, to realize a system-on-chip versatile architecture, which is equipped with almost every conceivable functionality. As a matter of course, to meet the above demand, the physical sizes of major components of a large scale integration (LSI) circuit, i.e., metal insulator semiconductor field effect transistors (MISFET's), or more specifically, metal oxide semiconductor field effect transistors (MOSFET's), have to be reduced accordingly. Unfortunately, however, further miniaturizing the MOSFET dimensions while speeding-up its operation is increasingly becoming a difficult task to achieve. In fact, as explained below, various technical difficulties arise from this attempt.

One of such difficulties arises from sharp decrease of threshold voltage with downscaling or shrinkage of the channel length of the MOSFET (i.e., physical length of the gate electrode), known as the short channel effect. When the threshold voltage comes to depend on the physical gate length, even a slight process variation during the gate electrode formation could result in unfavorable and uncontrollable deviation in the threshold voltage. Of course, a MOSFET with an unintended threshold voltage, that is very different from the designed value, leads to an erratic device operation. The device operation incompatible with the original intention may well totally impair the proper functionality of the entire circuit. In other words, in order to obtain a large number of identical devices, the short-channel-effect-induced sharp dependence of the threshold voltage on the physical gate length is extremely detrimental. The short-channel-effect-induced intolerance of even a minute fluctuation during the device fabrication processes makes it very difficult to manufacture an electric circuit composed of a great number of uniform and coherent components, such as a dynamic random access memory (DRAM).

From a viewpoint of its physical mechanism, this short channel effect is a result of distortion of an electric potential near the central portion of the channel region. The distortion is induced by electric fields at source/drain (S/D) electrodes. As the channel length decreases, the influence of S/D electric fields comes to reach the central portion of the channel, allowing premature channel currents to flow between S/D electrodes (i.e., reducing the threshold voltage). Hence, as widely recognized, by making the p-n junctions that forms S/D regions (i.e., S/D p-n junctions) shallower, the short channel effect can be avoided. However, simply decreasing the depth of the S/D p-n junctions causes unacceptable increase in the electrical resistances of the S/D electrodes. Obviously, it impedes high-speed transmission of electrical signals through the MOSFET, thereby totally dashing the original intention of miniaturizing the MOSFET dimensions to speed-up its operation.

One of the best ways of reducing the S/D electrode resistance is silicidation (i.e., compound formation between silicon and metal substance) of upper parts of S/D p-n junctions. The metal species that could be used for the silicidation includes cobalt (Co), titanium (Ti) and nickel (Ni). However, of these metals, Ni is the primary choice for the silicidation of fine structures employed by today's ULSI technology. This is because it is free from adverse line-width effects (i.e., resistivity increase of silicide layers when they are formed on narrow lines). In addition, the silicidation reaction between Si and Ni can be completed at a temperature as low as 450° C., which is much lower than the $CoSi_2$ formation temperature (800° C.). Moreover, this low temperature thermal treatment produces a layer of NiSi, which has a very low resistivity. However, caution is advised because applying yet additional thermal processing at a higher temperature of about 750° C. causes an unfavorable phase transition of the NiSi layer into a layer of $NiSi_2$, that has a higher electrical resistivity than that of NiSi. Thus, naturally, it is the NiSi layer of low resistance that is typically used for ULSI devices.

Unfortunately, however, NiSi is not a problem-free option. In fact, its thermal stability is the greatest concern of the NiSi technology. In general, after having formed the low-resistance NiSi layer, it is indispensable to perform thermal processing at 500° C. for about 90 minutes, for example, in order to establish good electrical contact between the NiSi layer and a metal substance formed thereon. However, even this moderate thermal processing (i.e., at 500° C. for 90 min), though it is done at a temperature well below the phase transition temperature, is found to trigger a substantial burst of Ni atoms from the NiSi layer deep into the Si substrate. The Ni burst is so invasive that Ni even reaches a depth of about 140 nm.

The Ni atoms thus-infiltrated deeply into the Si substrate form gap states in the forbidden band of Si, thereby assisting or promoting leakage generation. Since this Ni burst into the Si substrate is a genuine and intrinsic characteristic inherent to NiSi, it progresses unavoidably whenever NiSi and Si are in physical contact at an elevated temperature. Obviously, once such gap states are formed at the S/D junctions, substantial leakage currents flow through the junctions into the Si substrate. Eventually, an intended functionality of the device will be completely lost (e.g., loss of data memorized in DRAM cells).

Now that the general problems associated with the silicidation technique are clarified, next, some more specific difficulties in relation to another technical option for achieving high-performance semiconductor devices will be discussed below. Nowadays, besides the above silicidation technique, in an insatiable quest for high-speed operation of MOSFET, an additional means to improve the device operation is also explored. In fact, in order to maximize the carrier mobilities, their crystal orientation dependencies are exploited. It is known that, in the case of Si, the crystal plane of highest electron mobility is a Si(100) plane, whereas the plane capable of attaining the maximum hole mobility is a Si(110) plane, as disclosed in H. Irie et al., "In-Plane Mobility Anisotropy and Universality under Uniaxial Strains in n- and p-MOS Inversion Layers on (100), (110), and (111) Si," International Electron Devices Meeting (IEDM) Technical Digest, pp. 225-228 (2004).

A way of realizing integration of a complementary MOSFET (CMOSFET) circuitry with Si(100) surfaces for n-channel MOSFETs (n-MOSFETs) and Si(110) surfaces for p-channel MOSFETs (p-MOSFETs) is to make use of a direct silicon bonded (DSB) substrate, as taught from C. Sung et al., "High Performance CMOS Bulk Technology Using Direct Silicon Bond (DSB) Mixed Crystal Orientation Substrates," IEDM Tech. Dig., pp. 235-238 (2005).

In the DSB technique, a single-crystal Si layer with its principal surface being a (110) plane is directly bonded over a single-crystal Si(100) substrate. Then, specific surface regions (on which n-MOSFETs are to be formed) are selectively amorphized by ion implantation. Subsequent recrystallization referring to the underlying Si(100) substrate convert the surface orientation of the n-MOSFET formation regions from Si(110) into Si(100), while p-MOSFET formation regions retain the original surface orientation of Si(110).

Obviously, by forming respective MOSFETs on the optimum crystal planes depending on its conductivity type, carrier mobilities of both n-MOSFET and p-MOSFET can be maximized at once. Thus, the operation speed of the whole CMOSFET circuit can be increased, without suffering from commonly observed slow-down due to sluggish performance of either slower type of constituent MOSFETs. Furthermore, since it dispenses with a silicon-on-insulator (SOI) substrate, both conventional circuit designs and common manufacturing processes of bulk CMOS fabrication can be directly applied to the DSB technology, without any "special" considerations otherwise needed when using SOI substrate. This makes it possible to readily fabricate DSB CMOSFET devices by using the existing fabrication facility while, at the same time, avoiding increase in manufacturing costs.

Nonetheless, the DSB technique is not a problem-free option either. Unfortunately, with the above advantages come accompanying penalties as detailed below. The direct bonding between surfaces of incompatible crystal orientations naturally gives rise to a host of crystal defects, such as dislocations, due to substantial lattice mismatching at the bonding interface. In addition, in order to amorphize and recrystallize micro- or even nano-scale regions with a precise spatial resolution, the Si bonding layer has to be very thin. Accordingly, the crystal defects residing at or near the bonding interface are located very close to surfaces on which MOSFETs are to be formed.

Since no insulative material is formed between S/D diffusion layers and the defect-infested bonding interface, the S/D p-n junctions (which should be formed in close proximity to the bonding interface) are thus very vulnerable to leakage generation. The crystal defects at the bonding interface and/or secondary defects (which are originated from the primary defects at the bonding interface and propagated therefrom towards the substrate surface) could cause unacceptable junction leakage.

In particular, when the DSB technology is combined with the silicidation technique, the junction leakage becomes an intractable problem. This is because the crystal defects in the DSB substrate can significantly enhance the diffusion of metal atoms released from the silicide layer (i.e., transient enhanced diffusion). The rapidly migrating metal atoms can easily reach the junction between S/D regions and the underlying substrate, thereby producing uncontrollable junction leakage.

Now, obviously, in order to avoid the above junction leakage, an efficient way of suppressing the release and diffusion of metal atoms from the silicide layer must be devised. Otherwise, successful high-speed operation of miniaturized silicided MISFETs is totally unattainable.

SUMMARY OF THE INVENTION

This invention has been made in view of the above technical background, and its object is to provide a method of making a semiconductor device having source and drain regions which are silicided while retaining a shallow junction position and also suppressing junction leakage to low levels. Another object of the invention is to provide the semiconductor device as fabricated thereby.

In accordance with one aspect of the invention, a method of fabricating a semiconductor device having a metal insulator semiconductor field effect transistor (MISFET) includes the steps of forming at a surface of a silicon substrate a gate insulation film of the MISFET, forming a gate electrode on the gate insulation film, and forming a plurality of nickel silicide regions making up part of source and drain regions of the MISFET. These nickel silicide regions are provided on silicon surfaces with Si{110} crystal planes at both sides of the gate electrode. Each nickel silicide region has a rectangular planar shape with a long side perpendicular to a Si<100> direction on the silicon surface and a short side having a width of 0.5 μm or less and extending in parallel to the Si<100> direction.

In accordance with another aspect of the invention, a semiconductor device having a MISFET is provided, which includes a silicon substrate, a channel region of the MISFET formed in the substrate surface, a gate insulating film formed above the channel region, a gate electrode formed to overlie the channel region with the gate insulating film being sandwiched therebetween, a pair of spaced-apart source and drain regions formed to interpose the channel region therebetween, and a plurality of nickel silicide (NiSi) regions making up part of the source and drain regions of the MISFET. The NiSi regions are provided on silicon surfaces with Si{110} crystal planes in the source and drain regions. Each NiSi region is of a rectangular planar shape having long sides perpendicular to a Si<100> direction on the silicon surface and short sides with a width of 0.5 μm or less, which are parallel to the Si<100> direction.

According to this invention, it becomes possible to provide the method of fabricating a semiconductor device having the source/drain regions which are silicided while retaining a shallow junction position and also lowering the junction leakage. It is also possible to provide the semiconductor device as fabricated thereby.

DETAILED DESCRIPTION OF THE EMBODIMENTS

Figure 1:
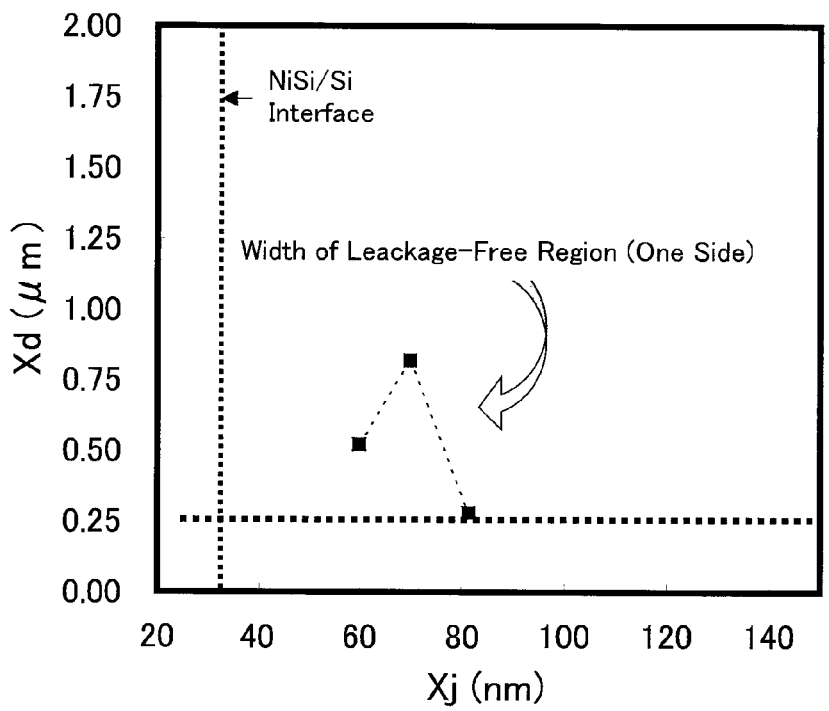
FIG. 1 is a diagram graphically showing leakage-free region width $X_d$ as a function of junction depth $X_j$.

The post-silicide annealing is indispensable to secure good electrical contact between the NiSi layer and a metal substance thereon via a very small opening (i.e., contact hole). Nonetheless, it has been found by the present inventor that even a moderate thermal processing at 500° C. for 90 min can generate substantial leakage through junctions, although the junction depths are much deeper than the silicide film. It is also notable that this leakage is generated during annealing at a temperature well below the phase transition temperature from NiSi to $NiSi_2$—i.e., 750° C.

However, from an in-depth research to elucidate impacts of NiSi film's geometrical configurations and also to clarify influences of the substrate crystal orientation on the thermal stability of the NiSi films, the present inventor has also found that the thermally-induced junction leakage can be suppressed totally, by appropriately forming the NiSi films on a specific silicon crystal plane, along a specific direction, with prescribed dimensions.

In the following, this crucial discovery to the present invention will be explained in detail, with reference to some of the accompanying figures of the drawing. However, before the detailed explanation, several cautions should be made in advance, on the terminology to be used hereafter.

In the following description, a crystallographically equivalent plane to a (abc) plane will be expressed by {abc}—for example, a {100} plane for a (100) plane, and {110} for (110). A surface parallel to a {abc} plane will be denoted by a {abc} surface for short. In addition, a crystal direction that is equivalent crystallographically to a [xyz] direction is represented by a <xyz> direction; for example, a <100> direction for [100], and <110> for [110].

Also note that in the description below, the term "channel direction" is used to indicate the direction of a channel current flow. Likewise, the term "gate direction" or "gate electrode direction" refers to the direction along which the gate electrode is elongated (i.e., orthogonal to the channel direction). The expression "a plurality of nickel silicide (NiSi) regions" is intended NOT to imply a single rectangular shape, but meant to indicate more than two isolated rectangular shaped NiSi layers or, alternatively, a singly-connected region obtained by combining such NiSi layers with additional NiSi layers. Therefore, even a comb-like pattern containing a plurality of rectangular shapes connected at their one-side ends or slit-like pattern connected at both-sides ends should be included in what is meant by the "plurality of NiSi regions." The term "source/drain (S/D) region" or "source/drain (S/D) electrode" denotes collectively an extension (diffusion) region of MISFET source/drain, a source/drain diffusion region, and a metal silicide region or else.

Now that all the necessary notational precautions are set, the principal findings of the present invention are ready to be disclosed below.

[Leakage from NiSi on Si(100)]

To begin with, leakage from a NiSi film on a Si(100) surface is described here. In order to investigate the leakage currents from the NiSi films, p/n junctions with various depths were fabricated on Si(100) substrates. Sputter-deposition of a nickel (Ni) film and ensuing rapid thermal annealing (RTA) in a nitrogen gas at 450° C. prompted 30 nm-thick nickel silicide (NiSi) formation over the junctions. After completion of the silicide layers, these silicided junctions were further annealed at 500° C. for 90 min in $N_2$ to gauge impacts of the heat stimulus. The temperature ramping/quenching rates were set to be 100° C. per minute. After this post-silicide annealing, leakage currents through the junctions of various depths were carefully measured.

(Areal Leakage Component)

Figure 2:
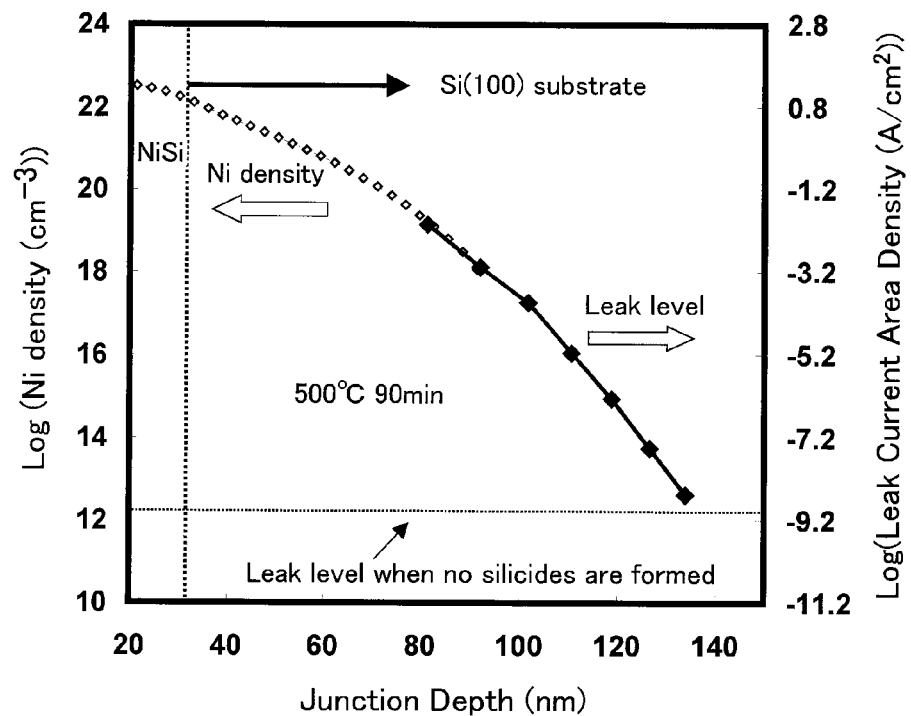
FIG. 2 is a graph showing the areal leakage current density (right-side axis) and Ni concentration (left-side axis) as a function of the junction depth for NiSi-silicided junctions on Si{100}

FIG. 2 shows areal leakage current density (i.e., leakage current flowing through unit junction area, right-side axis on logarithmic scale) as a function of the junction depth. In the figure, a depth profile of Ni concentration in the Si substrate as well as in the NiSi layer (left-side axis on logarithmic scale, obtained by backside secondary ion mass spectrometry (SIMS)) is also included to demonstrate clear correlation between the Ni depth profile and the leakage-depth profile. It should be noted that, since backside SIMS is conducted from the back-surface of the substrate opposing to the silicided surface, it is free from undesirable knocking of Ni atoms from the NiSi film into the substrate by SIMS measurements themselves. Thus, the Ni density in the Si substrate can be measured accurately by this method. The excellent matching obtained here between the Ni depth profile and the leakage-depth profile proves unequivocally that the excess junction leakage is generated by post-annealing-induced Ni infiltration deep into the Si substrate. For detail, see M. Tsuchiaki et al., "Junction Leakage Generation by NiSi Thermal Instability Characterized Using Damage-Free n+/p Silicon Diodes," Japanese Journal of Applied Physics (JJAP), Vol. 43, pp. 5166-5173 (2004).

(Peripheral Leakage Components)

Figure 3A:
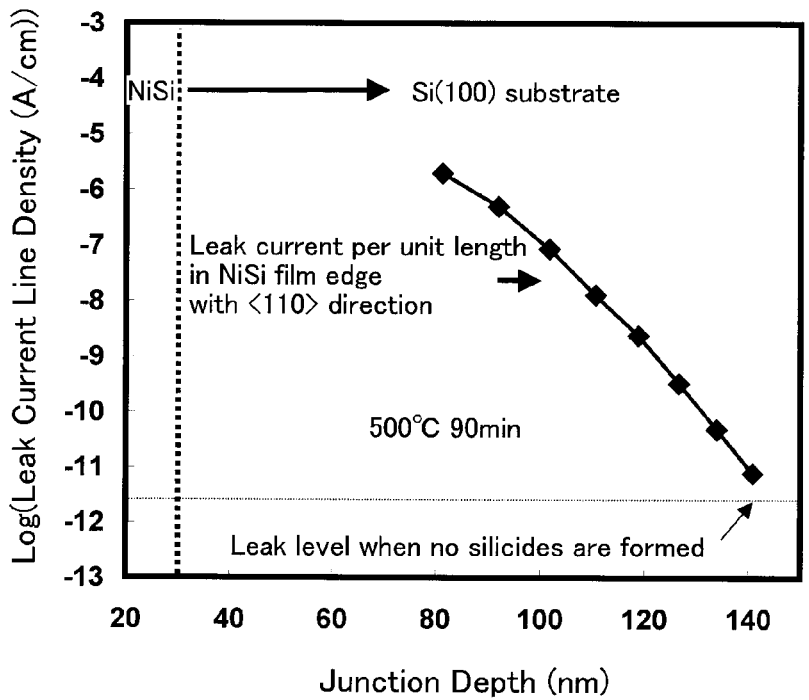
FIGS. 3A and 3B are graphs showing peripheral leakage components from NiSi on Si{100} along a Si<110> direction and along a Si<100> direction, respectively, as a function of the junction depth.

FIG. 3A plots peripheral leakage component along a Si<110> direction (i.e., an excess leakage component proportional to the perimeter length of the NiSi film) as a function of the junction depth. Much like the areal leakage component (which flows through the bottom of the NiSi silicided junction) substantial excess leakage currents are thermally induced near the perimeter of the junction as well. Ni must have permeated deeply into the Si substrate also at the edge of NiSi layer, quite in the same way as it infiltrates into the Si substrate at the bottom of the NiSi layer.

Figure 3B:
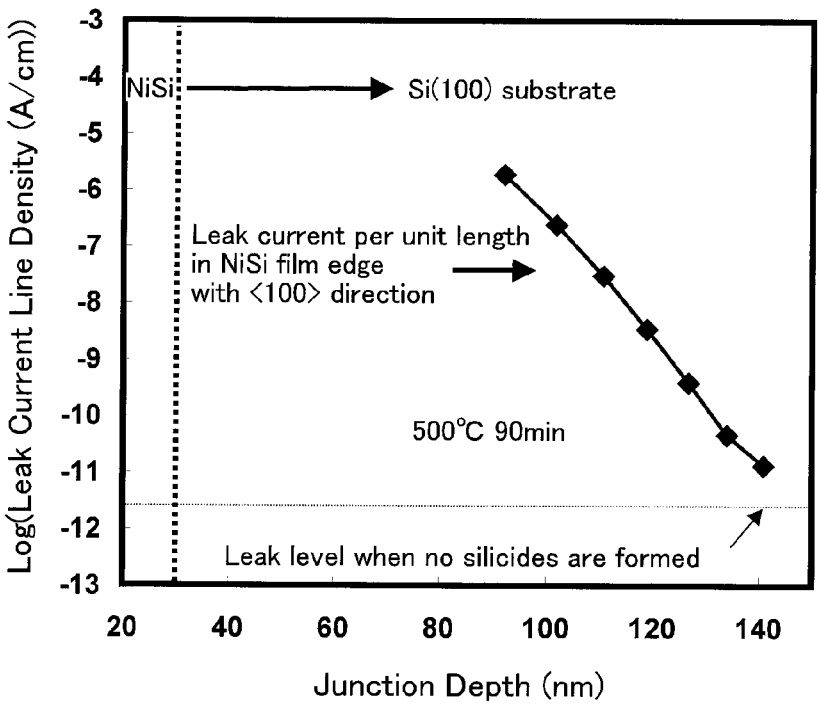

FIG. 3B plots peripheral leakage component along a Si<100> direction as a function of the junction depth. Substantial excess leakage currents, almost identically to the leakage along the Si<110>, are also thermally induced near the perimeter of the junction along Si<100>.

Obviously, at the edges of a NiSi layer on Si(100), excess leakage currents are thermally induced irrespective of the directions of their perimeters. Ni must have burst into the Si substrate regardless of its location, either near the edge or at the bottom of the NiSi film. Remembering that NiSi's phase transition into $NiSi_2$ has not been observed during the post-silicide annealing, the above Ni's behavior is nothing but an inherent and intrinsic nature of NiSi layers formed on the Si(100) surface.

[Leakage from NiSi on Si(110)]

Next, leakage from a NiSi film on a Si(110) surface is described below. Repeating the experimental procedure for Si(100), pn-junctions with NiSi layers are prepared on Si(110) substrates and successively post-annealed. Then, the leakage currents through the junctions of various depths are carefully monitored.

(Areal Leakage Component)

Figure 4:
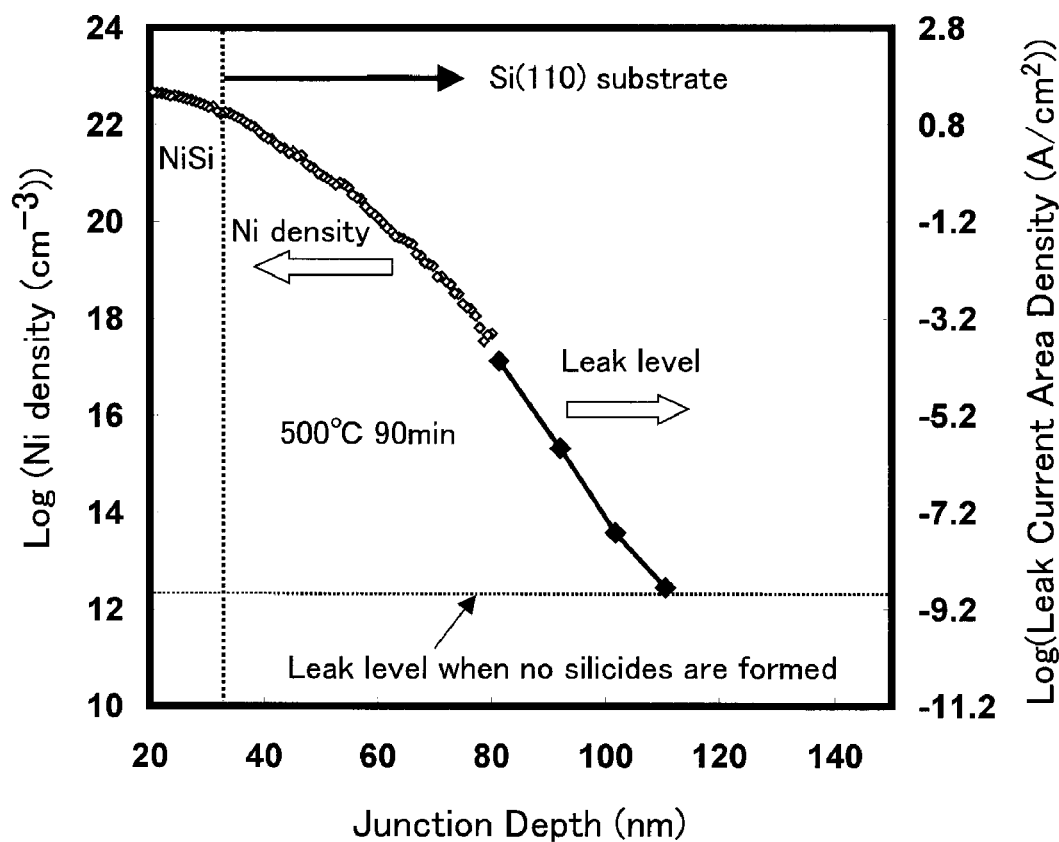
FIG. 4 is a graph showing the areal leakage current density (right-side axis) and Ni concentration (left-side axis) as a function of the junction depth for NiSi-silicided junctions on Si{110}.

FIG. 4 shows areal leakage current density (right-side axis, on logarithmic scale) as a function of the junction depth. In the figure, a depth profile of Ni concentration in the Si substrate as well as in the NiSi layer (left-side axis, on logarithmic scale, obtained by backside secondary ion mass spectrometry (SIMS)) is also included to demonstrate clear correlation between the Ni depth profile and the leakage-depth profile. The excellent matching obtained here also on Si(110) substrates proves once again that the excess junction leakage is generated at the bottom of the NiSi film by post-annealing-induced Ni infiltration deep into the Si substrate. Although the junction leakages for Si(110) junctions are slightly lower than those for Si(100) junctions, there is no doubt in that the excess leakage is thermally induced deep inside the Si(110) substrate, much like the Si(110) substrate.

(Peripheral Leakage Components)

Figure 5A:
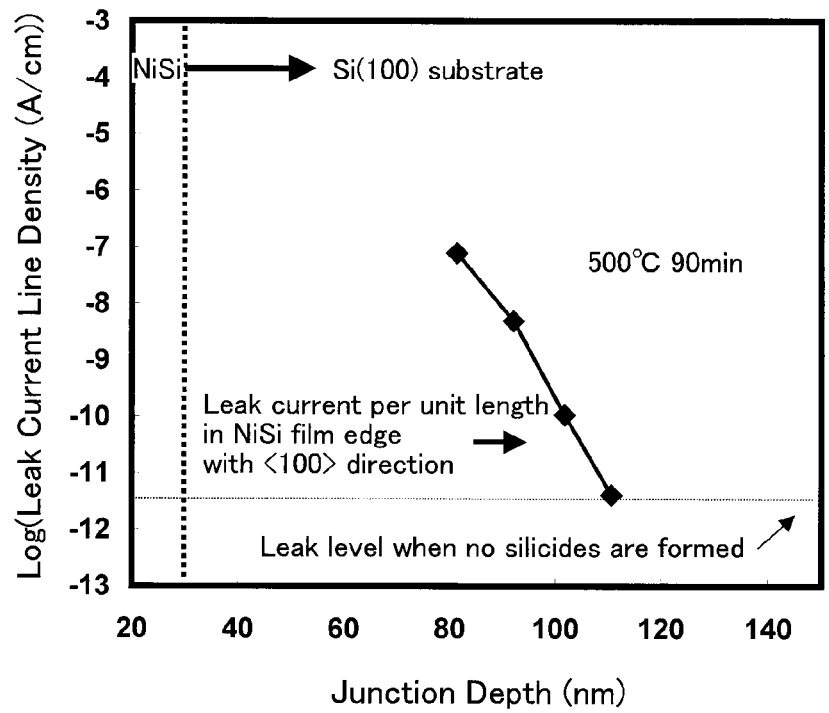
FIG. 5A is a graph showing peripheral leakage component from NiSi on Si{110} along a Si<100> direction as a function of the junction depth.

FIG. 5A plots peripheral leakage component along a Si<100> direction as a function of the junction depth. Very similarly to the areal leakage component, the thermal treatment has induced substantial excess leakage currents near the perimeter of the junction. Ni must have also permeated deep into the Si substrate at the edge of NiSi layer along Si<100>, in much the same way as it infiltrates into the Si substrate at the bottom of the NiSi layer.

Surprisingly, however, it was found by the inventor that, once the perimeter is re-oriented along Si<110> direction (i.e., the direction perpendicular to the Si<100>), no excess leakage is generated near this specific edge portion of the NiSi film. In other words, very strikingly, it is found that the leakage can be even reduced by increasing the perimeter length along Si<110>, while keeping the same total area of the NiSi film. For example, against common expectation, the total leakage from two identical rectangular NiSi films on Si{110} surface, say, with 5 µm-long edges along Si<100> and 10 µm-long edges along Si<110> each, is surprisingly smaller than the leakage from a single square-shaped NiSi film with 10 µm-long edges along both Si<100> and Si<110> directions (i.e., a NiSi film obtained by combining the previous two rectangular NiSi films along the Si<110> edges).

Figure 5B:
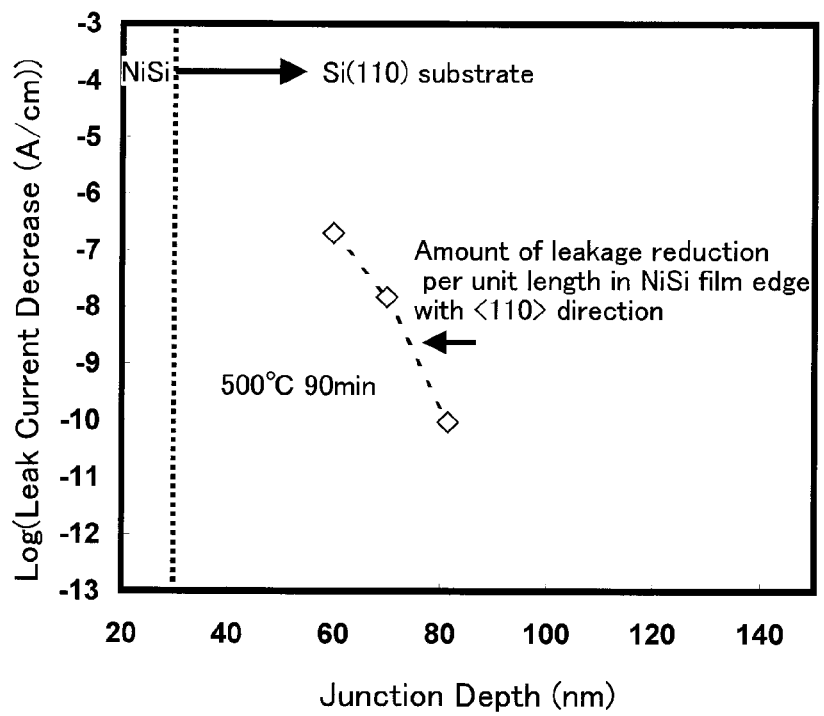
FIG. 5B is a graph showing leakage reduction attained by introducing additional unit length of perimeter along a Si<110> direction into NiSi-silicided junctions on Si{110} surface as a function of the junction depth.

In fact, FIG. 5B plots this leakage reduction attained by introducing additional unit length of perimeter along Si<110> into NiSi-silicided junctions on Si(110) surface as a function of junction depth. Very interestingly, as apparent from the figure, the shallower the junction, the greater the leakage reduction.

Figure 6:
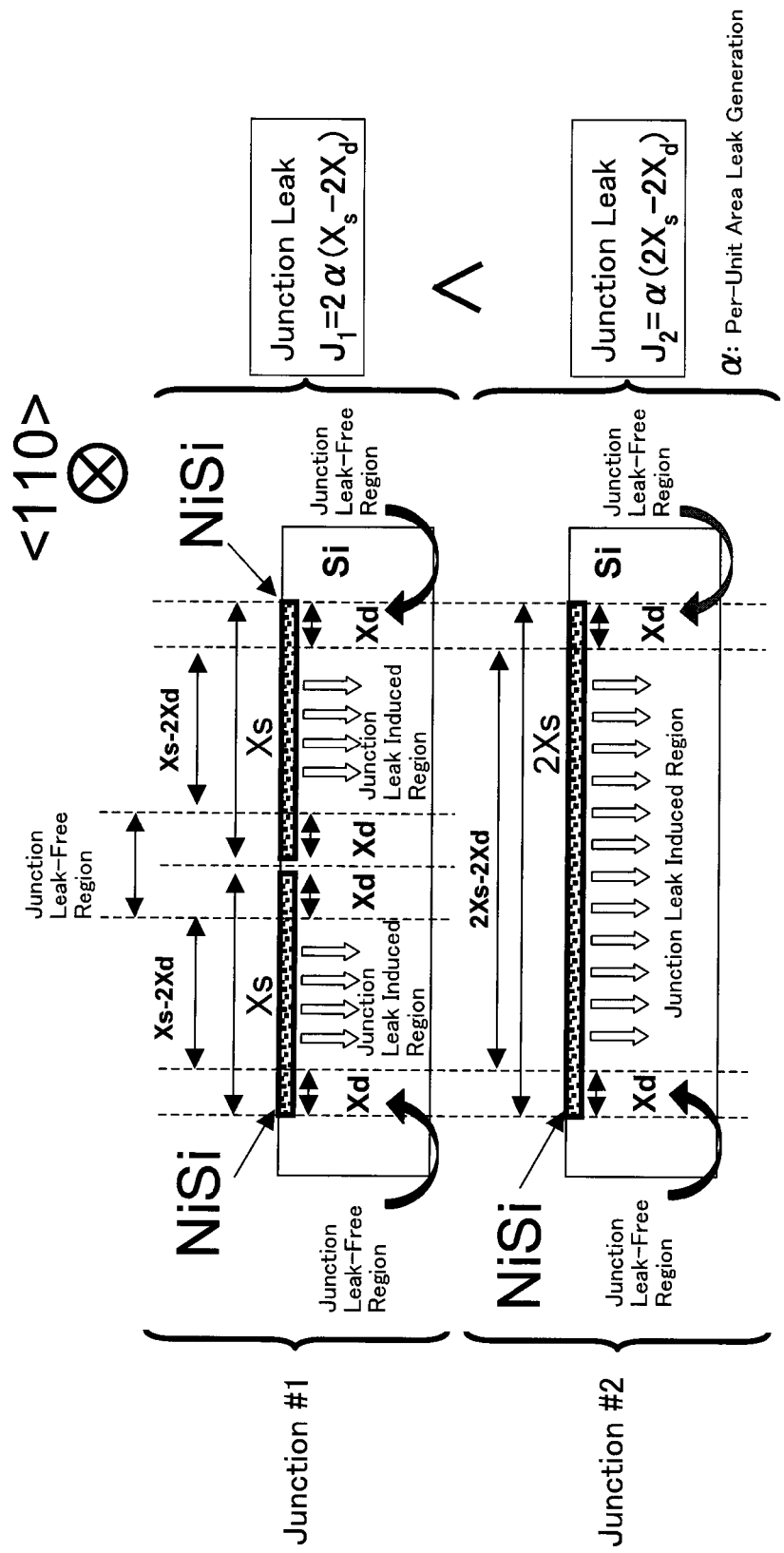
FIG. 6 is a conceptual diagram for explaining leakage reduction attained by introducing additional perimeters along Si<110> into NiSi-silicided junctions on a Si{110} surface.

As a matter of course, the amount of leakage cannot become a negative value. Therefore, as diagrammatically explained in FIG. 6, the leakage reduction attained by introducing additional perimeters along Si<110> into NiSi-silicided junctions implies that the leakage associated peripheral regions is practically eliminated within some finite distance, $X_d$, from the edges along Si<110>. It seems that the peripheral NiSi regions along Si<110> are stable against heat stimulus and no leakage is generated there. The width $X_d$ of this leakage-free region can be obtained from Equation (1) explained in FIG. 6, by comparing total leakage $J_1$ from two stripe junctions along Si<110> (i.e., Junction #1, $X_s$-wide along the Si<100> each) and leakage $J_2$ from a single strip junction along Si<110> (i.e., Junction #2, $2X_s$-wide along the Si<100>). Note that FIG. 6 shows cross-sections of NiSi films by a Si{110} plane. Thus-obtained leakage-free width $X_d$ is shown in FIG. 1 as a function of junction depth. Despite the data scattering observed, it is safe to say that, within at least 0.25 µm from an edge along Si<110>, no leakage is generated.

Furthermore, the relatively stable $X_d$ values against junction depth variation, in contrast to the much more precipitous (i.e., exponential) dependence of the bottom leakage on the junction depth, can also explain the depth-dependence of the leakage reduction as observed in FIG. 5B. Since the leakage at the bottom of the NiSi film increases very sharply for shallower junctions, by introducing additional perimeters along Si<110>, and thereby transforming a certain (i.e., a largely depth-independent amount of) leakage-generating bottom area into leakage-free peripheral regions, the greater leakage reduction is attained with the shallower junction.

Figure 7A:
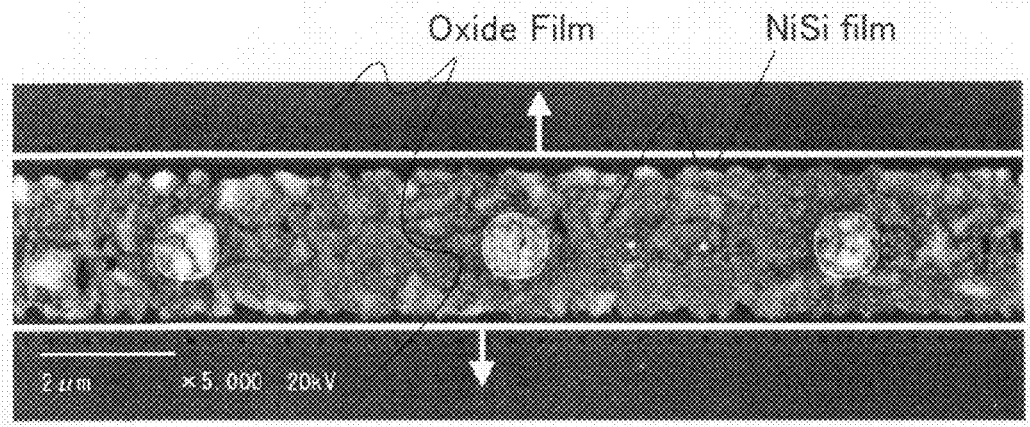
FIG. 7A shows a scanning electron microscope (SEM) top view of a fine line-shaped NiSi film running along the Si<100> direction on a Si{110} plane.
Figure 7B:
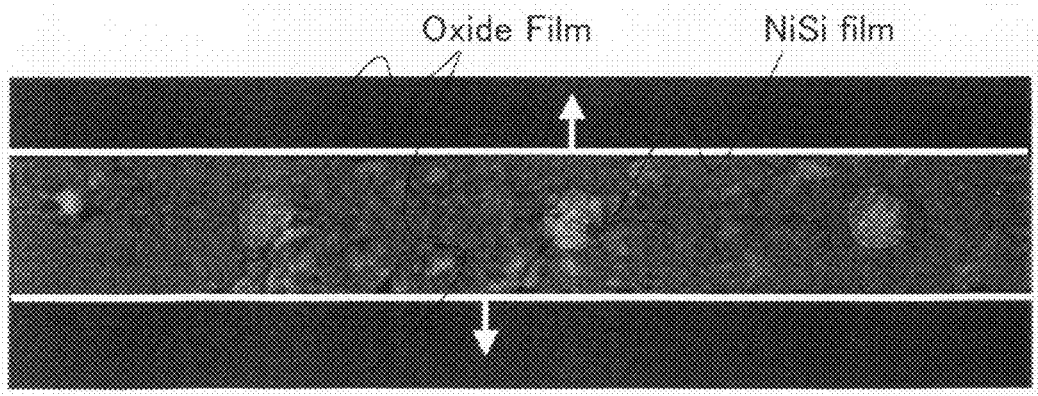
FIG. 7B shows a SEM top view of a fine line-shaped NiSi film running along the Si<110> direction on a Si{110} plane.

Now, it is clear that, for a NiSi film formed on Si(110), peripheral NiSi regions along Si<110> are leakage-free, whereas excess leakage is generated near the perimeter along Si<100>. In order to probe the physical origin of this particularity, first, the surface morphology of the NiSi films is investigated by the scanning electron microscopy (SEM). FIG. 7A shows a top view of a fine line-shaped NiSi film running along the Si<110> direction on Si(110) plane. Note that, from these edges, excess leakage is generated. FIG. 7B shows a top view of a fine line-shaped NiSi film running along the Si<110> direction on Si(110) plane. The peripheral regions are free from excess leakage. Apparently the NiSi's leakage-generating edges along Si<100> are ragged and corrugated in shape, indicating substantial loss of Ni atoms from these edges into the Si substrate. In contrast, the NiSi's leakage-free edges along Si<110> are smooth and linear in shape, suggesting the absence of Ni infiltration into the Si substrate. Here, by the direct physical analysis, it is substantiated that no junction leakage is generated along the Si<110> edges.

Figure 8A:
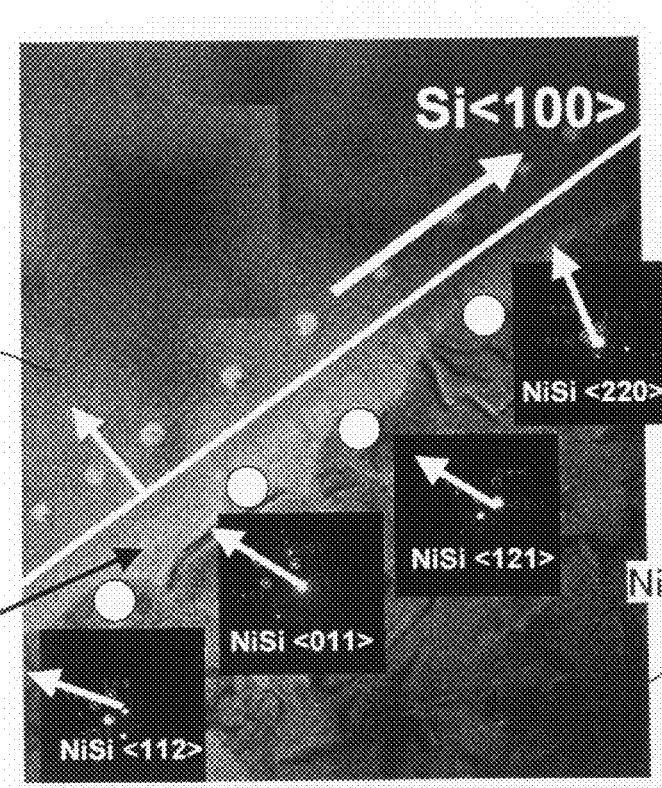
FIG. 8A shows sampling points (white circles) on horizontal transmission electron microscope (TEM) picture of the NiSi film along Si<100> on Si{110}, together with the associated diffraction patters of the individual NiSi grains and their in-plane crystal orientations (white arrays).
Figure 8B:
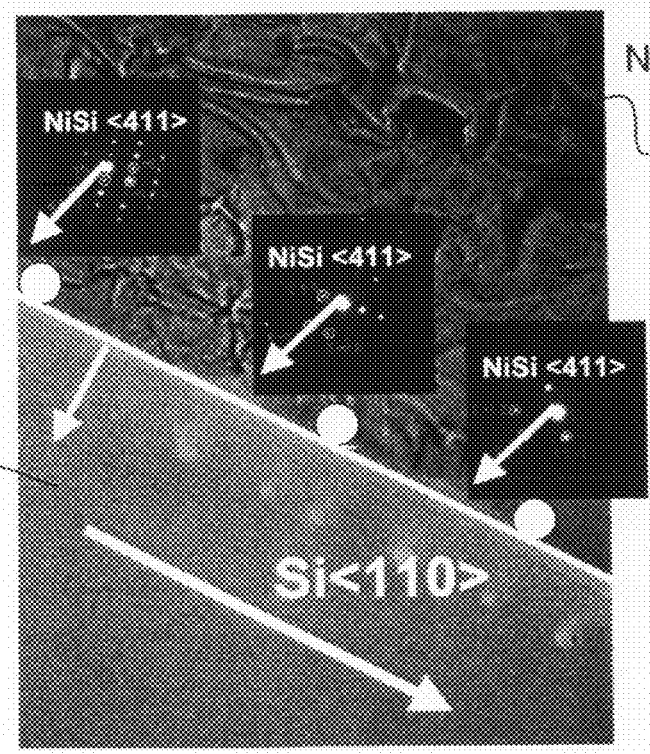
FIG. 8B shows sampling points (white circles) on horizontal TEM picture of the NiSi film along Si<110> on Si{110}, together with the associated diffraction patters of the individual NiSi grains and their in-plane crystal orientations (white arrays).

Next, in order to shed deeper light on the root cause of the perimeter's orientation dependency, the crystal alignments of the NiSi film on Si(110) is analyzed by electron beam microdiffraction patterns. Since the NiSi film has a polycrystalline structure, in order to secure conclusive evidence, multiple points are selected for the analysis on each NiSi film along Si<100> or Si<110>. FIG. 8A indicates sampling points (white circles) on horizontal transmission electron microscope (TEM) picture of the NiSi film along Si<100>. The associated diffraction patters of the individual NiSi grains and their in-plane crystal orientations (white arrays) are also shown. Likewise, FIG. 8B shows corresponding sampling points on NiSi film along Si<110>, together with the associated diffraction patterns and their crystal orientations. Apparently, along the leakage-generating Si<100> edge, individual grains of the polycrystalline NiSi are aligned randomly and incoherently. In contrast, along the leakage-free Si<110> edge, the individual grains are highly oriented, pointing their NiSi<411> directions almost squarely towards the film edge (i.e., NiSi<411> being normal to Si<110>). It seems likely that some better crystalline compatibility with the Si substrate and/or certain interfacial stress relaxation (which might have specifically taken place during silicidation reaction along the Si<110> edge regions) may have led to the emergence of the above-observed highly aligned NiSi grains. Obviously, thus-obtained NiSi grains, that are terminated with NiSi{411} planes at their sides, must be thermally stable compared to other grains bounded by different crystal planes. Moreover, the highly aligned NiSi grains may form a structurally tighter and physically more robust perimeter than that made up of randomly-oriented structurally-incoherent grains. This may further contribute to improve the thermal stability of NiSi perimeter along Si<110>.

As evident from the above experiment, near peripheral regions along Si<110> edges, the grains of NiSi on Si{110} tend to align their NiSi<411> directions towards Si<100> direction, thereby forming thermally-stable and structurally-robust perimeters. As a result, Ni infiltration from the peripheral regions, at least within 0.25 μm from the NiSi edges, is totally suppressed. Therefore, no leakage is generated from these regions.

Now, it is clear that, in order to obtain silicided MOSFETs with minimal S/D junction leakage, first, one has to provide exposed Si{110} planes within the S/D regions for ensuing silicidation process. Second, one must form line-shaped NiSi layers along Si<110> direction on the Si{110}, so that their widths across Si<100> directions are deliberately kept less than 0.5 μm (i.e., limiting the distance from any point within a layer to its either nearer Si<110> edge below 0.25 μm).

In other words, one can reduce leakage from a NiSi film, even if its width across Si<100> is greater than 0.5 μm, by intentionally dividing the film into stripes of NiSi layers, so that their widths across Si<100> are all made to be less than 0.5 μm. Forming gaps or fine spacings along Si<110> at intervals of 0.5 μm or less is a powerful and universal way to suppress leakage from any shaped NiSi films formed on Si{110}.

Now, currently preferred embodiments which effectively exploit the above-stated leakage-free regions near the Si<110> edges of the NiSi film to the advantage of MISFET fabrication will be described below.

First Embodiment

The first embodiment making use of the above-explained principle of the present invention provides a semiconductor device with a complementary metal oxide semiconductor field effect transistor (CMOSFET) structure formed on a DSB substrate, where performances of both n-channel and p-channel MOSFETs can be maximized. This CMOSFET device on the DSB substrate includes an n-channel MOSFET (n-MOSFET) with an elevated source/drain (ESD) structure formed on a Si{100} plane and a p-channel MOSFET (p-MOSFET) with the ESD structure on a Si{110} plane. This embodiment also provides a method of fabricating the DSB/ESD-CMOSFET device. The fabrication process includes steps of forming grooves having Si{110}-face sidewalls and Si{100}-face bottoms within the n-MOSFET S/D regions and making NiSi silicidation to proceed selectively only on the Si{110}-face sidewalls. The fabrication process also includes steps of forming grooves having Si{100}-face sidewalls and Si{110}-face bottoms within the p-MOSFET S/D regions and making NiSi silicidation to proceed excluding the Si{100}-face sidewalls. In addition, thanks to the improved thermal stability made available in the present invention, the following fabrication method can readily realize a DSB/ESD-CMOSFET device having very shallow S/D junctions while maintaining very low junction leakage currents and, at the same time, securing excellent electrical contacts with interconnect metals.

Now, the fabrication steps of the first embodiment will be described with reference to FIGS. 9 through 22B below.

Figure 9:
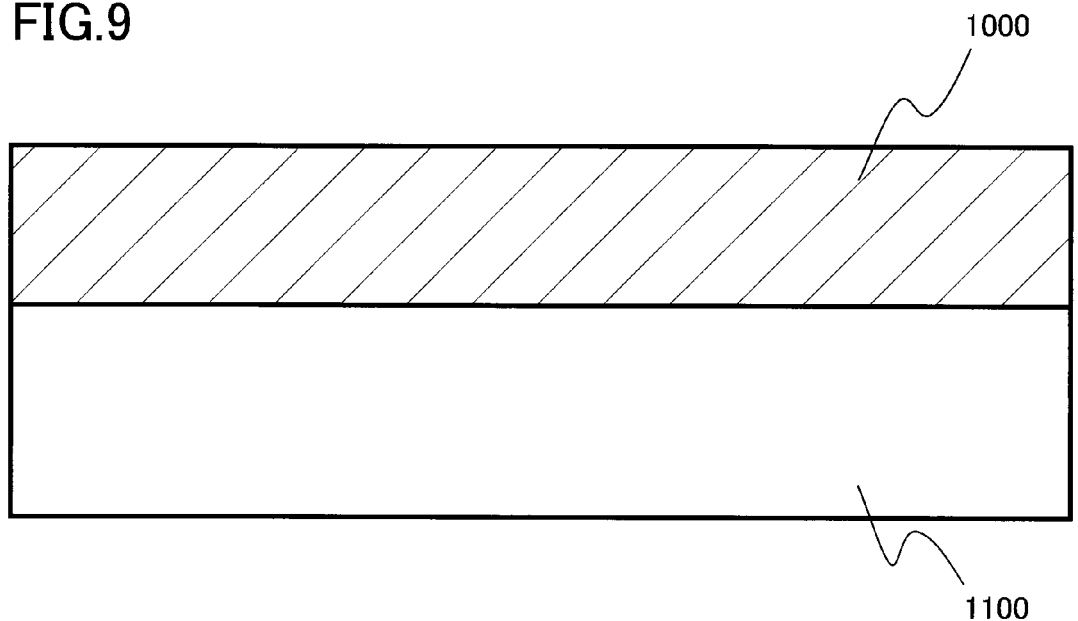
FIGS. 9 through 22B illustrate, either in cross-section or in plan view diagrams form, some major process steps of a fabrication method of the semiconductor device in accordance with first embodiment of the invention.

First, as shown in FIG. 9, over a p-conductivity type single-crystalline Si(110) substrate (or wafer) 1100, a p-type single-crystal Si(100) substrate (or wafer) 1000 is directly bonded. The Si substrates 1000 and 1100 can be directly bonded by treating the bonding surfaces with a diluted hydro fluoric (HF) solution, then pressing the bonding surfaces tightly on each other, and finally annealing them in an argon (Ar) gas, for example. Through these processes, dangling Si atoms on a bonding surface come to form chemical linkages with terminal Si atoms on the other bonding surface, so that these substrates are made to adhere tightly to each other.

Figure 10:
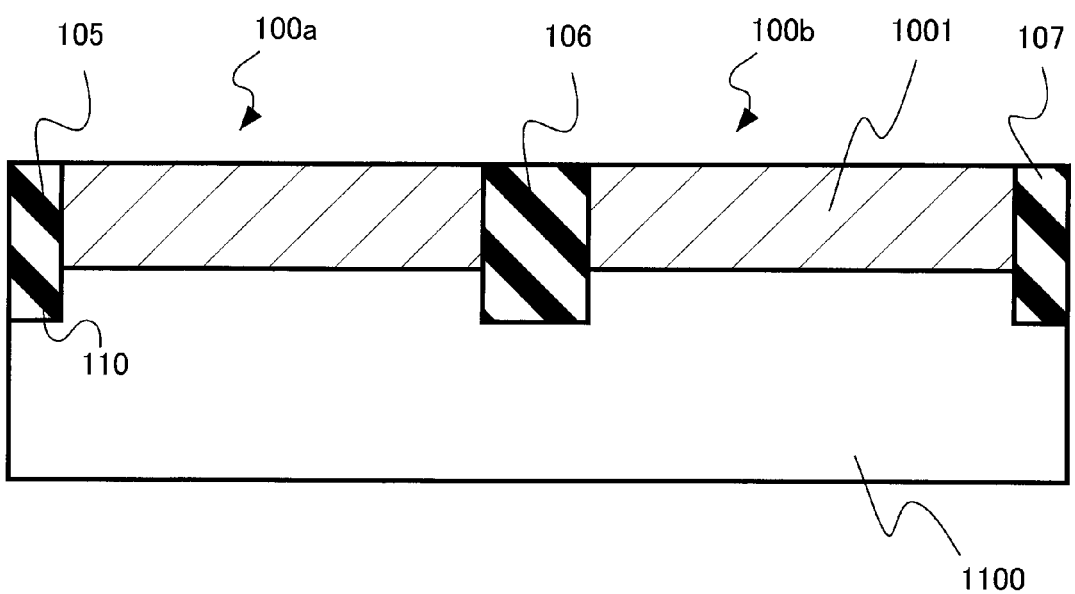

Next, as shown in FIG. 10, by polishing its surface with known techniques including chemical mechanical polishing (CMP), the Si substrate 1000 is thinned down into a single-crystal Si layer 1001 on the Si(110) substrate 1100. Then, a plurality of shallow trenches 105, 106 and 107, through the Si layer 1001, down to the underlying Si substrate 1100 are formed making use of the known techniques such as lithography and reactive ion etching (RIE). By subsequently filling up these trenches with an insulative material, e.g., silicon oxide (SiO$_x$), using known techniques such as chemical vapor deposition (CVD) and CMP, device isolation regions (i.e., shallow trench isolation (STI) regions) are formed. These STI regions surround and isolate an n-MOSFET formation area 100a and a p-MOSFET formation area 100b.

Figure 11:
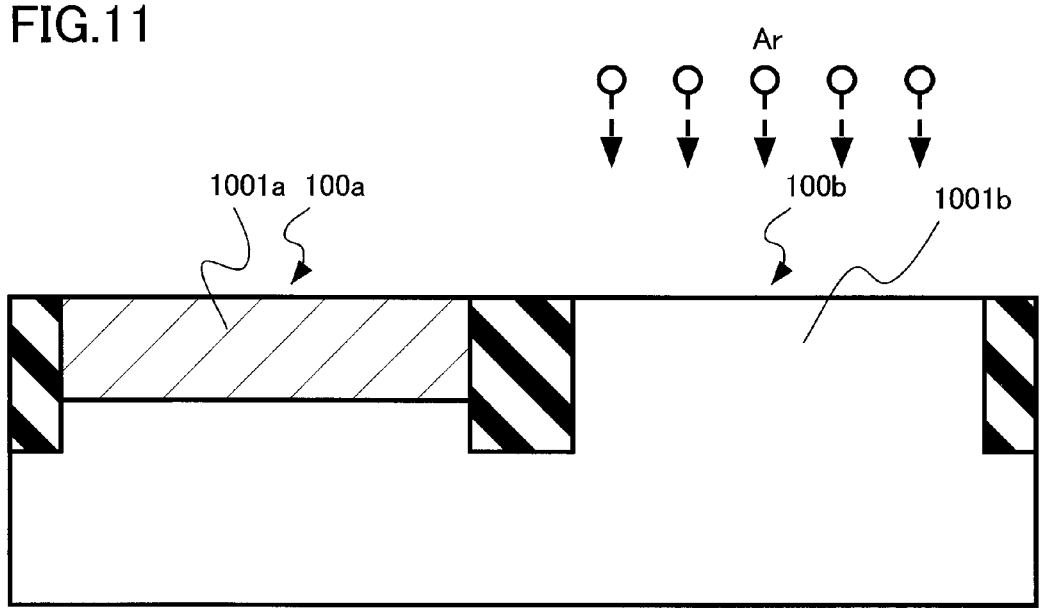

Next, as shown in FIG. 11, Ar ions are implanted selectively only into the p-MOSFET formation area 100b, making use of known techniques including lithography, so that the entire Si layer 1001 of the p-MOSFET formation area is exclusively turned into an amorphous layer. Subsequent recrystallization of this amorphized Si layer creates a Si(110)-surface region 1001b, which forms a single crystal with the Si substrate 1100 below. This is because the recrystallization process of the amorphous layer proceeds in reference to the lattice ordering of the underlying single-crystal Si substrate 1100, to which the amorphous layer has a direct physical contact. Of course, a single-crystal Si layer 1001a in the n-MOSFET formation area 100a retains its original Si(100) surface. In this way, a DSB substrate is realized.

Figure 12:
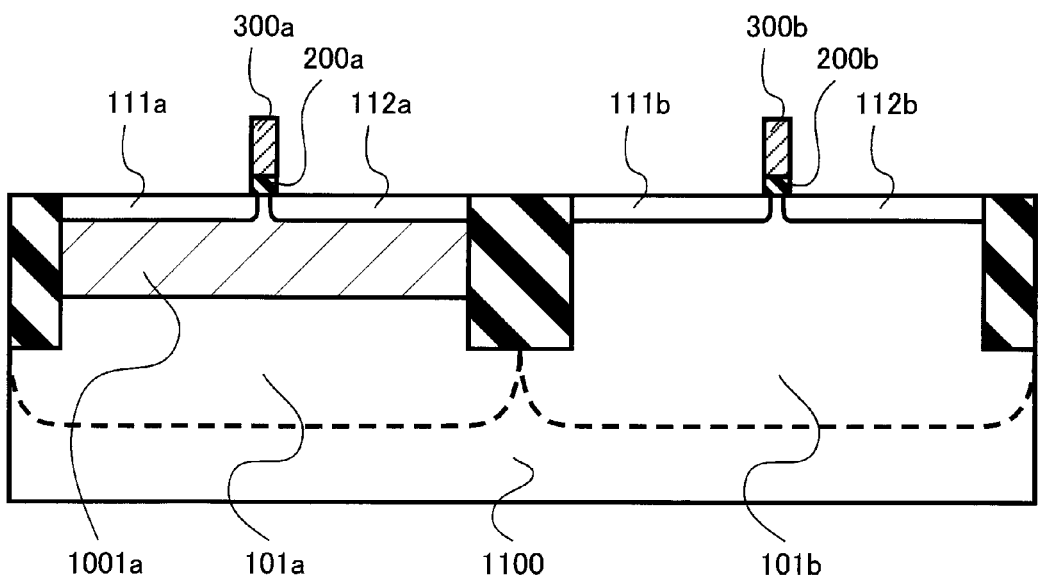

Then, as shown in FIG. 12, p-type well region 101a and n-type well region 101b are respectively formed in the n-MOSFET and the p-MOSFET regions, by known processes including ion implantation and thermal processing. Thereafter, a gate insulative film of about e.g., 5 nm thickness is formed over the DSB substrate by e.g., thermal oxy-nitridation techniques. Thereon, a gate-electrode-forming polycrystalline silicon (to be denoted as simply poly-Si in short hereafter) film of about e.g., 200 nm thickness is deposited by e.g., CVD.

By making use of the photo-lithographical patterning, the gate insulative film and the poly-Si film are subsequently RIE-etched to form a stacked structure of gate insulator film 200a and gate electrode 300a thereon in the n-MOSFET formation area 100a and also a stacked structure of gate insulator film 200b and gate electrode 300b in the p-MOSFET formation area 100b, as shown in FIG. 12. Further, shallow impurity diffusion layers 111a and 112a of n-type conductivity are formed at right and left sides of gate electrode 300a by ion implanting an n-type impurity onto the p-well 101a surface, using the gate electrode 300a and a photoresist film covering the n-well region as masks of the implantation. Likewise, shallow impurity diffusion layers 111b and 112b of p-type conductivity are formed at both sides of gate electrode 300b. These shallow diffusion layers will serve as S/D extension regions of MOSFETs to be formed hereafter.

Figure 13:
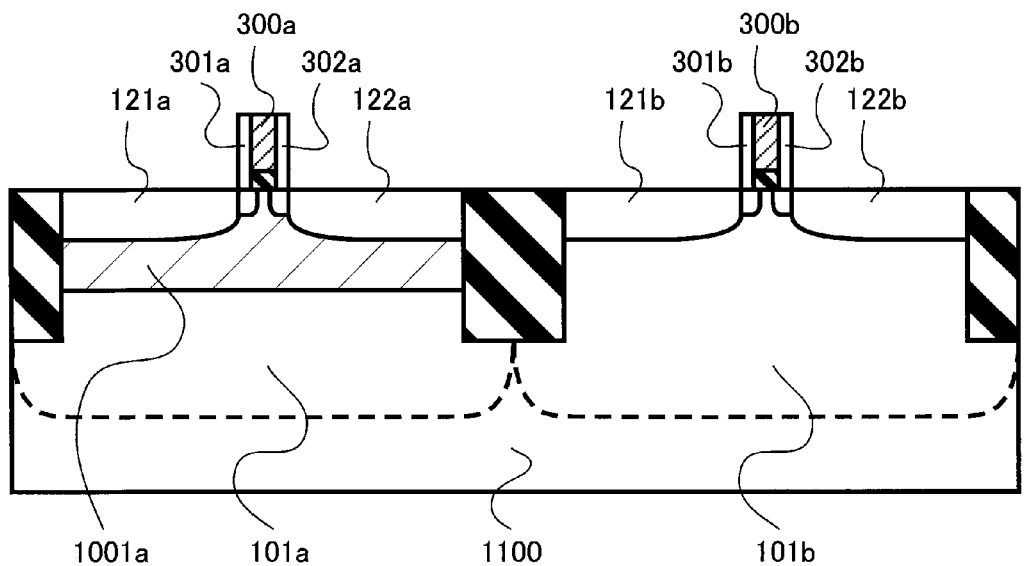

Then, by conformally depositing a stack of a silicon nitride (SiN) film of e.g., 10 nm thick and a silicon oxide ($SiO_x$) film of e.g., 10 nm thick and successively RIE-etching the stacked films, double-layered gate sidewalls 301a, 302a, 301b and 302b are formed as shown in FIG. 13. On completion of the gate complex (i.e., the gate electrode, the underlying gate insulator film and insulative sidewalls), a pair of source and drain (S/D) regions 121a and 122a of n-type conductivity are formed at both sides of the n-MOSFET gate complex by ion implanting an n-type impurity onto the p-well 101a surface, using the gate complex and a photoresist film covering the n-well region as masks of the implantation. Likewise, a pair of S/D regions 121b and 122b of p-type conductivity are formed at both sides of the p-MOSFET gate complex. Of course, these S/D ion implantations also introduce n- and p-type impurities into respective gate electrodes, 300a and 300b. Then, the incorporated impurities are electrically activated by applying e.g., rapid thermal annealing (RTA). The depths of S/D diffusion regions 121a-b and 122a-b should be adjusted to be, e.g., about 50 nm after the activation.

Figure 14:
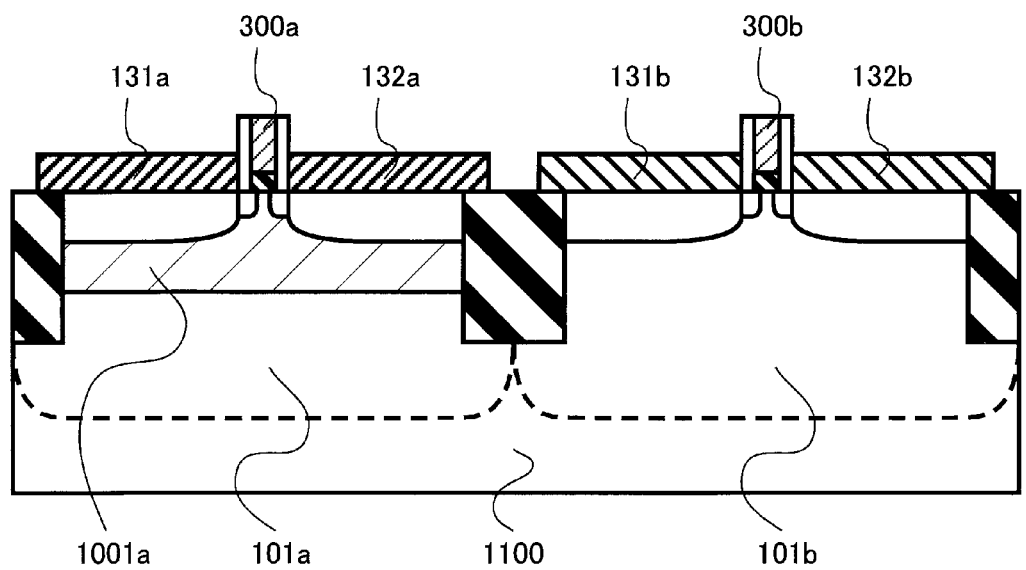

Next, as shown in FIG. 14, by epitaxial growth techniques, single-crystal Si layers 131a and 132a are formed on the S/D diffusion regions 121a and 122a, respectively. Likewise single-crystal Si layers 131b and 132b are formed on the S/D diffusion regions 121b and 122b, respectively. Needless to say, the Si layers 131a and 132a have Si{100} surfaces and the Si layers 131b and 132b have Si{110} surfaces. These Si layers 131a-b and 132a-b, whose thicknesses should be adjusted to be e.g., about 50 nm, will serve as parts of elevated S/D electrodes of respective MOSFETs. The epitaxial growth can be accomplished under appropriate process conditions. For example, supplying $SiH_2Cl_2$ gas at a flow rate of 300 cubic centimeters per minute ($cm^3$/min), HCl gas at 200 $cm^3$/min and $H_2$ gas at 10000 $cm^3$/min to a Si substrate held at 800° C. in a total gas pressure of 10 torr. Under these process conditions, the epitaxial layers also grow laterally over the adjacent STI regions 105, 106, 107 as shown in FIG. 14. It should be noted here, since portions of the S/D electrodes (i.e., extending parts of the laterally grown epitaxial layers) are brought over the STI regions, in effect, their capacitive coupling to the substrate can be reduced. This contributes to speed-up the resulting device operation.

Of course, during the epitaxial growth, Si layers are also formed on the gate electrodes 300a-300b, although not specifically illustrated in FIG. 14. Regarding electrical doping of the epitaxially-grown single-crystal Si layers, it can be done by further supplying impurity-containing gases during epitaxial growth or more conventionally by implanting impurities after the growth. Alternatively, it is also possible to form the single-crystal Si layer prior to the formation of S/D diffusion regions 121a-b and 122a-b and thereafter perform impurity implantation not only to dope the single-crystal Si layers but also to form S/D diffusion regions as well. In addition, it is also mentioned here that the single-crystal Si layers can be otherwise formed by depositing an amorphous Si layer and re-crystallizing it in reference to the lattice ordering of the underlying DSB substrate.

FIG. 15A shows a top plan view of the device structure at this stage. The crystal orientations of each additionally formed single-crystal Si layer are also specified in the figure. The gate electrode 300a of n-MOSFET runs along the Si<110> direction. On the other hand, the gate electrode 300b of p-MOSFET runs along Si<100> direction, because Si<110> is the best channel direction for p-MOSFETs to achieve the highest hole mobility. The sides of the single-crystal Si layers 131a and 132a are terminated by Si{110} planes. On the other hand, the sides of single-crystal Si layers 131b and 132b are terminated by Si{100} planes along the channel direction and by Si{110} planes along the gate electrode direction.

Here, it should be mentioned, although the present crystalline configuration of the Si layers is preferable to attain leakage-free NiSi-silicided shallow S/D junctions, the present invention does not exclude other device structures with NiSi layers formed directly over S/D diffusion regions, sparing the single-crystal Si layer formation.

Figure 16:
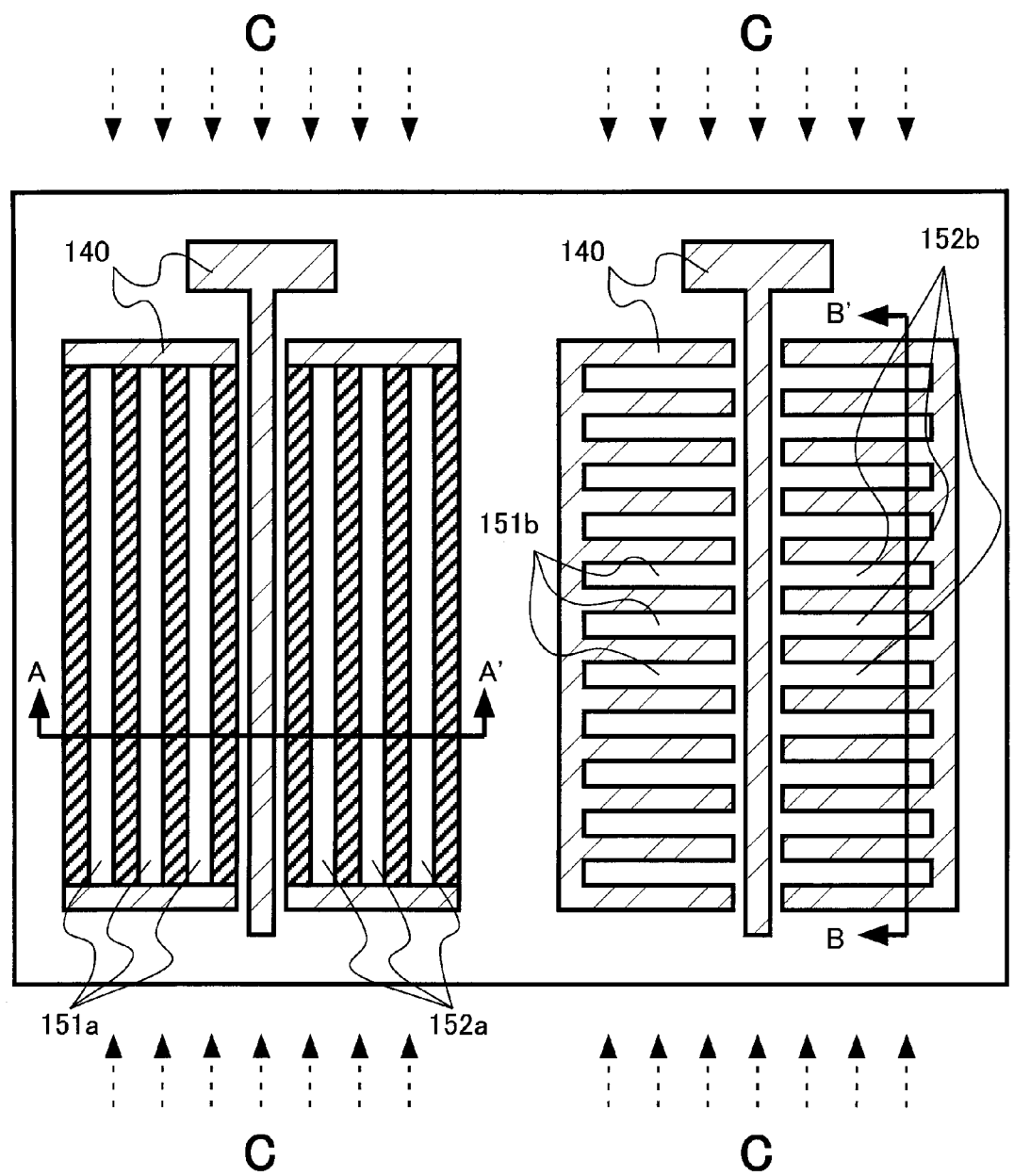

Next, after blanket deposition of a SiN film 140 over the entire surface of the device structure by e.g., CVD, an opening to the n-MOSFET S/D regions is formed in the SiN film using e.g., lithography and RIE. The shape of the opening is specifically designed to exclude areas near the both ends of the n-MOSFET S/D regions in the gate electrode direction, so that laterally-grown Si layers extending over the STI regions near these ends remain to be covered with the SiN film. Then, into thus-exposed single-crystal Si layers 131a and 132a, a plurality of equally spaced parallel grooves 151a, 152a are formed along the gate electrode direction by e.g., lithography and RIE. Again, the peripheral regions near the Si layer's both ends in the gate electrode direction are spared from grooving, resulting in slit-like planar patterns on the n-MOSFET S/D regions as shown in FIG. 16. Likewise, by etching all the way through the SiN film 140 down into the single-crystal Si layers 131b and 132b on the p-MOSFET S/D regions, a plurality of parallel grooves 151b, 152b are also formed along the Si<110> direction (i.e., along the channel direction) but excluding the Si layer's far end portions from the gate electrode which extends over STI regions. As a result, comb-shaped patterns appear on the p-MOSFET S/D regions as shown in FIG. 16. The depth of the grooves 151a-b and 152a-b into the Si layers is set to be 50 nm for example and the grooves are better to be arranged in repetitive arrays with a period or pitch of less than 0.5 μm.

Figure 15:
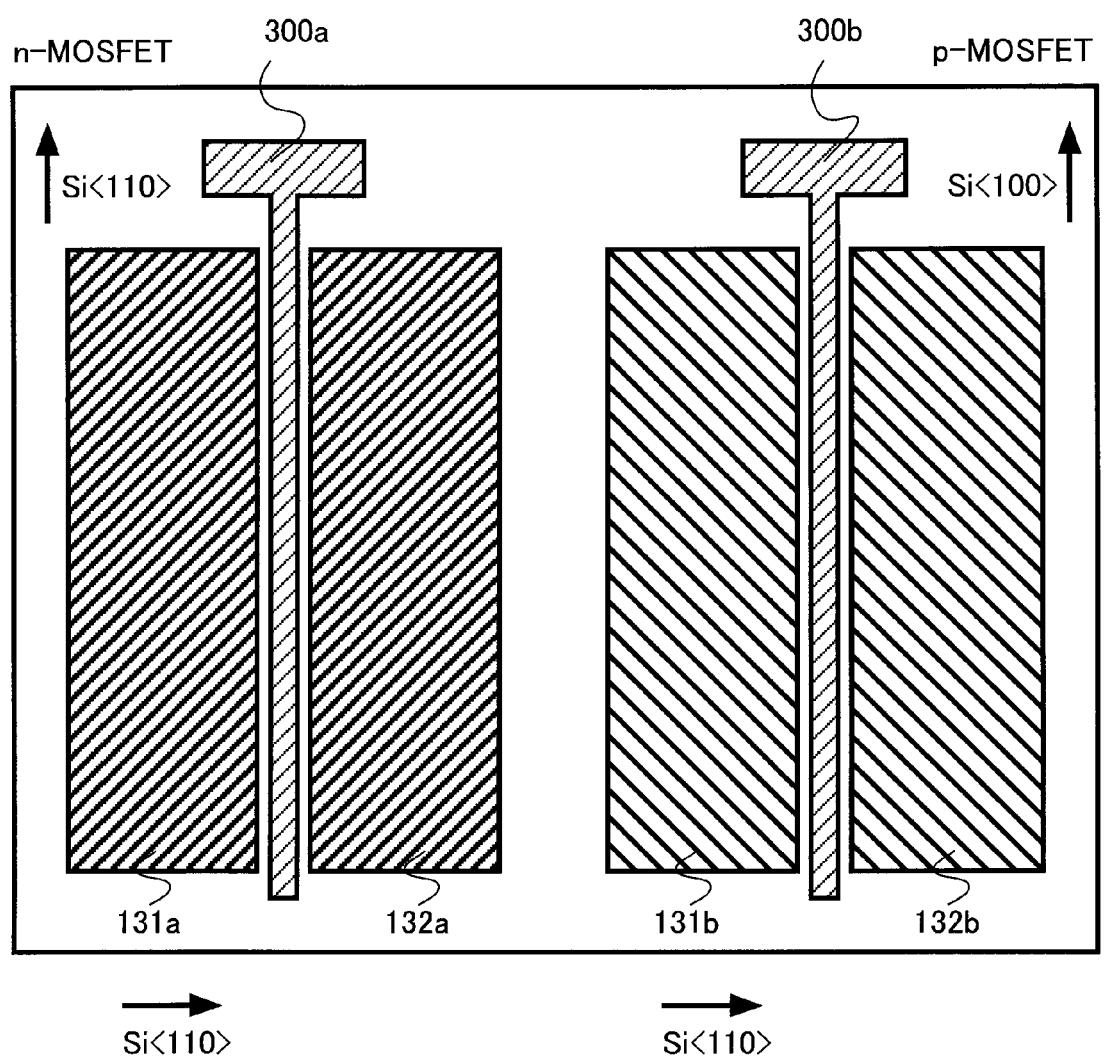

As can be understood from FIG. 15 and FIG. 16, the sidewalls of each groove 151a, 152a are all made of Si{110} planes. On the other hand, the major (i.e., longer) sidewalls along the channel direction of grooves 151b and 152b are made of Si{100} planes. Then, as a next step, as also shown in FIG. 16, carbon (C) atoms are ion implanted obliquely with incidence directions tilted from the normal incidence towards the gate electrode direction.

Figure 17A:
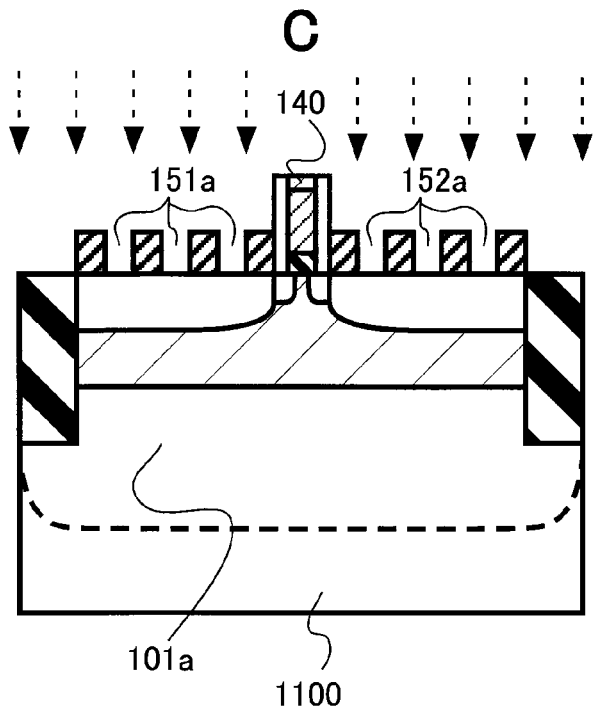
Figure 17B:
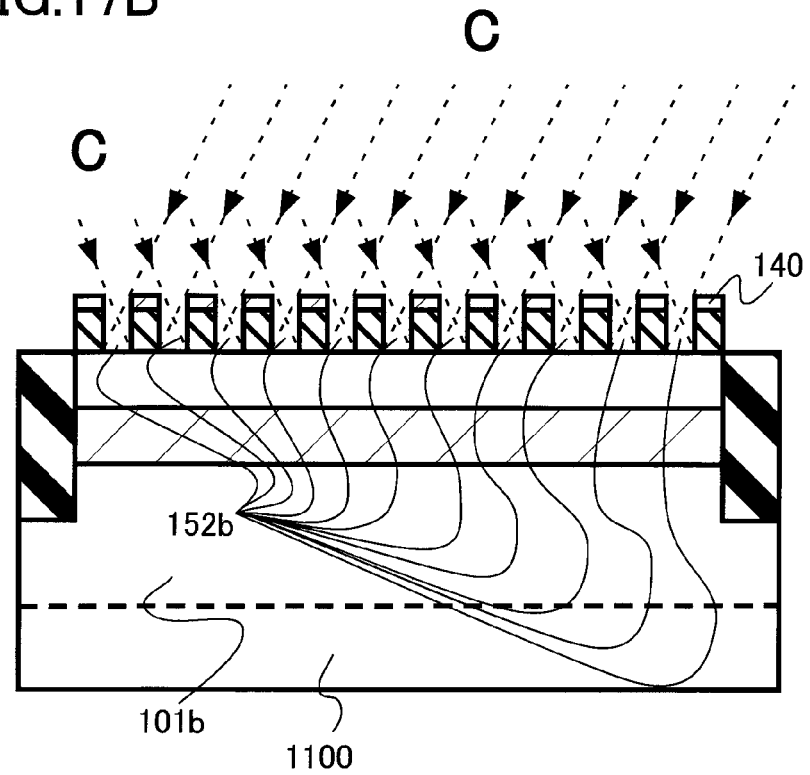

FIG. 17A shows a cross-sectional view of the structure along the line A-A' in FIG. 16. Likewise, a cross-sectional view along the line B-B' in FIG. 16 is also demonstrated in FIG. 17B. In each sectional view, incident directions of the tilted C implantation are also indicated by dotted-line arrows. The angle of the C ion implantation must be carefully adjusted so that C ions are made to impinge on the Si{100} sidewalls along the channel direction of the grooves 151b and 152b in the p-MOSFET S/D regions, but not on the Si{110} bottoms of these grooves. Of course, the groove's Si{110} sidewalls along the gate electrode direction are spared from C bombardment. It should be remembered here that the upper surfaces of the Si layers 131b and 132b of p-MOSFET are still covered with the SiN film 140 and form comb-like shapes with their far ends from the gate electrode connected. On the other hand, the slit-shaped surfaces of the Si layers 131b and 132b of n-MOSFET are connected at both ends in the gate electrode direction, only where the SiN film 140 remains. As a result, carbon-containing Si layers are formed on the Si{100} sidewalls along the channel direction of the grooves 151b and 152b in the p-MOSFET S/D regions, on the exposed top surface portions of single-crystal Si layers 131a and 132a over the n-MOSFET S/D regions, on the bottom surfaces and along-the-channel-direction Si{110} sidewalls of the grooves 151a and 152a in the n-MOSFET S/D regions. The typical thickness of these C-containing Si layers is a few nanometers (nm) and their carbon concentration exceeds 1 atomic percent (at %). At this stage, the remaining SiN film 140 is removed away by dipping it in a heated phosphoric acid solution.

Figure 18A:
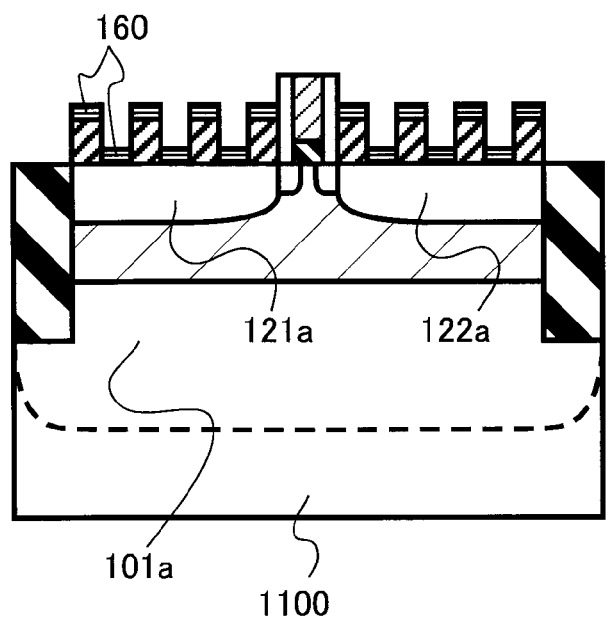
Figure 18B:
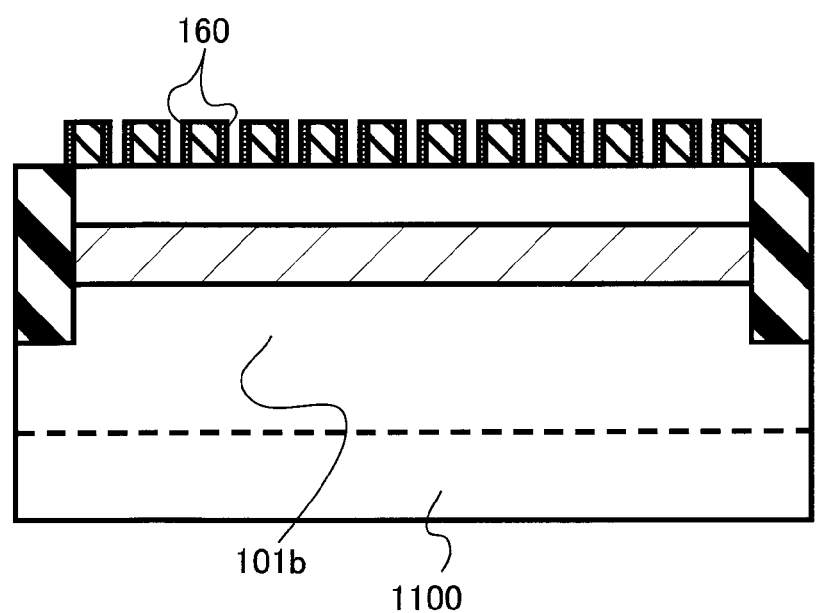

Subsequent thermal oxidation of the C-containing Si layers can produce peculiar HF-resistant (i.e., being insoluble in a HF solution) carbon-containing silicon oxide films about 1 to 2 nm thick, in a way as disclosed in U.S. Pat. No. 6,271,566 B1 to M. Tsuchiaki (assigned to TOSHIBA Corporation). Thus, by wet etching the oxidized substrate with a diluted HF solution (200:1), the HF-resistant carbon-containing $SiO_x$ films 160 are left only on the Si{100} sidewalls along the channel direction of the grooves 151b and 152b in the p-MOSFET S/D regions, on the central portion of the top surface of single-crystal Si layers 131a and 132a over the n-MOSFET S/D regions, on the bottom surfaces and along-the-channel-direction Si{110} sidewalls of the grooves 151a and 152a in the n-MOSFET S/D regions. On the other hand, the top surface of the of single-crystal Si layers 131b and 132b over the p-MOSFET S/D regions, the bottom surfaces and along-the-gate-direction Si{110} sidewalls of the grooves 151b and 152b in the p-MOSFET S/D regions, the both end-portions in the gate electrode direction of the top surface of single-crystal Si layers 131a and 132a over the STI regions adjoining the n-MOSFET S/D regions, and the along-the-gate-direction Si{110} sidewalls of the grooves 151a and 152a in the n-MOSFET S/D regions are exposed, as shown in FIGS. 18A and 18B.

It should be noted that thus-exposed Si surfaces, excluding the both end-portions of the top surface of single-crystal Si layers 131a and 132a over the STI regions adjoining the n-MOSFET S/D regions, are all made up of Si{110} planes. The exposed top surfaces of the crystal Si S/D layers of the n-MOSFET (i.e., the combining "crosspiece portions" of the slit-shaped top surfaces) are over the STI regions, not directly above the S/D regions. Moreover, the exposed Si{110} planes are constituted from rectangular components with their widths across the Si<100> directions being below 0.5 μm, except the far-end portions of the top surfaces of the crystal-Si S/D layers 131b and 132b over the p-MOSFET S/D regions (i.e., the connecting "shaft portions" of the comb-shaped top surfaces) which are also over the STI regions, not directly above the S/D regions. Therefore, as far as they are directly over the S/D diffusion regions 121a-b and 122a-b, all the exposed Si regions are composed of line-shaped Si{110} planes elongated along Si<110> directions with their widths across Si<100> directions being kept less than 0.5 μm. Of course, the method of exposing the fine line-shaped Si{110} plane regions along the Si<110> direction should not be limited to the above-stated tilted carbon ion implantation. It may alternatively be done by other available methods, for example, by an appropriate combination of lithography and film deposition, together with RIE or wet etching processes applied independently to the n-MOSFET and p-MOSFET regions.

However, it should be mentioned here that the tilted carbon ion implantation in this embodiment enables cost-saving one-stroke easy exposure of the fine line-shaped Si{110} planes along the Si<110> direction in S/D regions of both n-MOSFET and p-MOSFET over the DSB substrate, without resort to costly processes like lithography.

Next, a nickel (Ni) film, e.g., about 12 nm thick is sputter-deposited over the entire surface of resultant structure. The Ni film may be covered with a cap layer, such as Ti or TiN film, to prevent undesirable disturbance from an ambient gas during ensuing silicidation reaction. Following rapid thermal annealing (RTA) at 450° C. for 30 seconds in nitrogen promotes silicidation reaction between Si and Ni when they are in direct physical contact. Of course, Ni on the C-containing $SiO_x$ film as well as on other insulating materials remains unreacted. Such unreacted Ni can be selectively removed by wet etching in a mixed solution of sulfuric acid and hydrogen peroxide.

Figure 19:
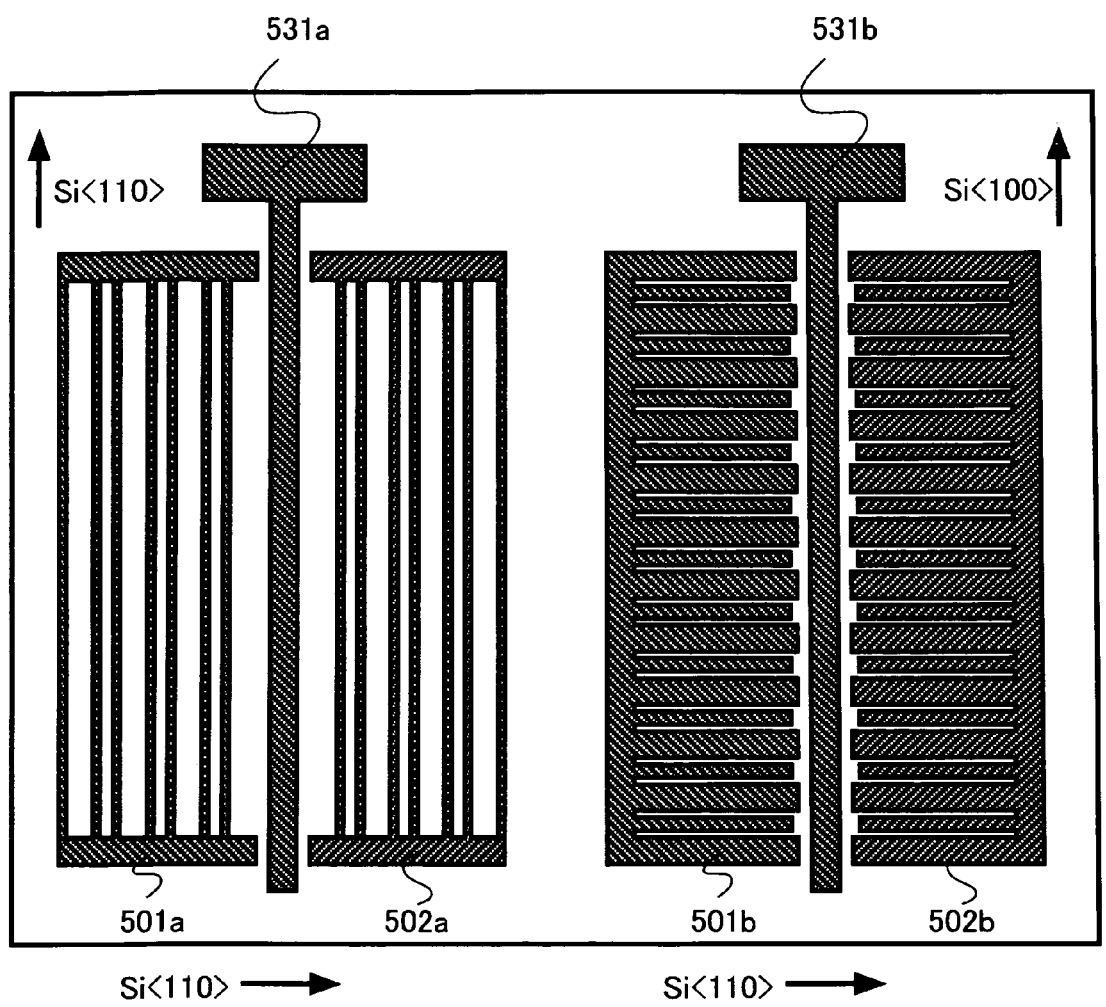
Figure 20A:
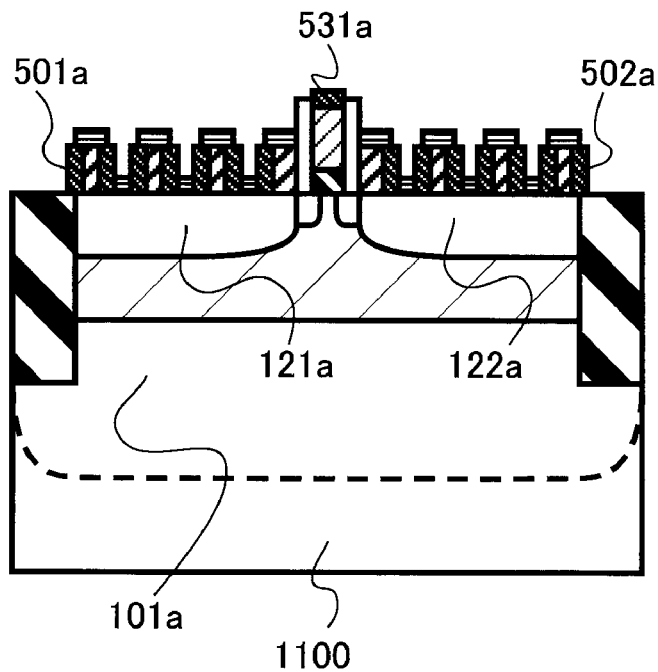
Figure 20B:
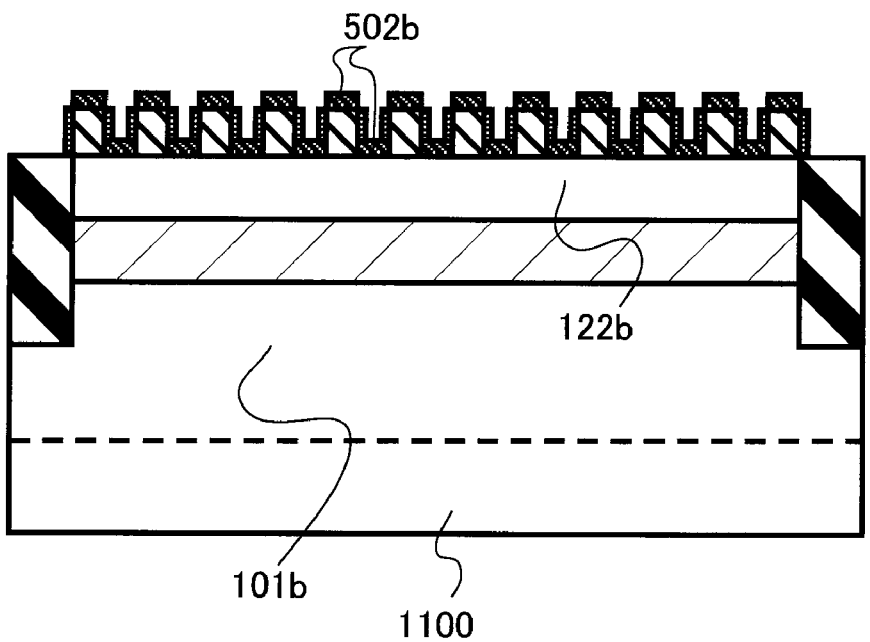

As a result, NiSi layers 501a and 502a are formed on the both end-portions in the gate electrode direction of the top surface of single-crystal Si layers 131a and 132a over the STI regions adjoining the n-MOSFET S/D regions, and the along-the-gate-direction Si{110} sidewalls of the grooves 151a and 152a in the n-MOSFET S/D regions, while a NiSi layer 531a is formed on the gate electrode of the n-MOSFET. Likewise, NiSi layers 501b and 502b are formed on the top surface of the of single-crystal Si layers 131b and 132b over the p-MOSFET S/D regions, the bottom surfaces and along-the-gate-direction Si{110} sidewalls of the grooves 151b and 152b in the p-MOSFET S/D regions, while a NiSi layer 531b is formed on the gate electrode of the p-MOSFET. These are shown in FIG. 19 as plan view (where only NiSi layers are shown for simplicity) and also in FIGS. 20A and 20B as cross-sections corresponding to FIGS. 18A-18B, respectively.

In this way, just over the S/D regions, a plurality of rectangular NiSi layers are formed only on Si{110} planes with their widths across the Si<100> direction being below 0.5 μm. The NiSi layers formed on the combining "crosspiece portions" of the slit-shaped top surfaces of single-crystal Si layers 131a and 132a over the n-MOSFET S/D regions and the NiSi layers on the connecting "shaft portions" of the comb-shaped top surfaces of single-crystal Si layers 131b and 132b over the p-MOSFET S/D regions are over the STI regions, not directly above the S/D regions. Accordingly, just over the S/D regions, the NiSi's grains align their NiSi<411> direction towards Si<100> direction so that the grains are terminated with NiSi{411} planes at the edges running along the Si<110> direction. Therefore, the thermal stability of these NiSi layers improves significantly so that no leakage is generated even upon indispensable post-silicide annealing at 500° C., because no Ni atoms are directly injected into the substrate below from the NiSi layers.

Of course, from the NiSi layers over the STI regions, no leakage can be generated, since no Ni atoms are allowed to infiltrate into the substrate. Thus, the NiSi-induced junction leakage can be suppressed almost completely. Otherwise, if NiSi is formed simply all over the 50 nm-thick single-crystal Si layer, as conventionally done for the usual elevated S/D MOSFET structure, substantial leakage would be generated on a thermal processing at 500° C. It should be also noted here that, in each source or drain region, the constituent NiSi layers also form a singly-connected metallic electrode, i.e., connected by NiSi layers on the "crosspiece portions" of the top surface of single-crystal Si layer over the STI regions, in the case of an n-MOSFET S/D region, and combined by NiSi layers on the "shaft portion" of the top surface of the of single-crystal Si layer and along-the-gate-direction Si{110} sidewalls of the grooves, in the case of a p-MOSFET S/D region.

The formation of the singly-connected metallic electrodes over the respective S/D regions is very desirable in view of making electrical contacts to the S/D regions because it enables process simplification (i.e., borderless contact) as will be discussed in detail later. Also, it should be mentioned that, by setting the pitch of the groove arrays smaller than the groove depth, in each n-MOSFET S/D region, the total contact area between the singly-connected NiSi electrode and the Si material can exceed the horizontally-projected planer area-size of the S/D region. Therefore, the overall contact resistance of the singly-connected NiSi electrode to the S/D region can be reduced compared with a silicide layer in a conventional elevated-S/D-MOSFET structure.

It should be also understood that the term "rectangular shape" of the NiSi layer is used to indicate its approximate figure in a broad sense, not to imply a mathematically-ideal and geometrically-perfect rectangle. A rectangular shaped NiSi layer may have slightly curved or ragged edges with or without somewhat rounded corners, due to possible fluctuations during device fabrication processes and/or because of innate variations of grain sizes in the individual NiSi layer.

The next step of the fabrication is deposition of an inter-layer dielectric (ILD) film 700 over the device structure. Preferably, this ILD film is made up of a stack of thin SiN film and thick $SiO_x$ film thereon.

Figure 21A:
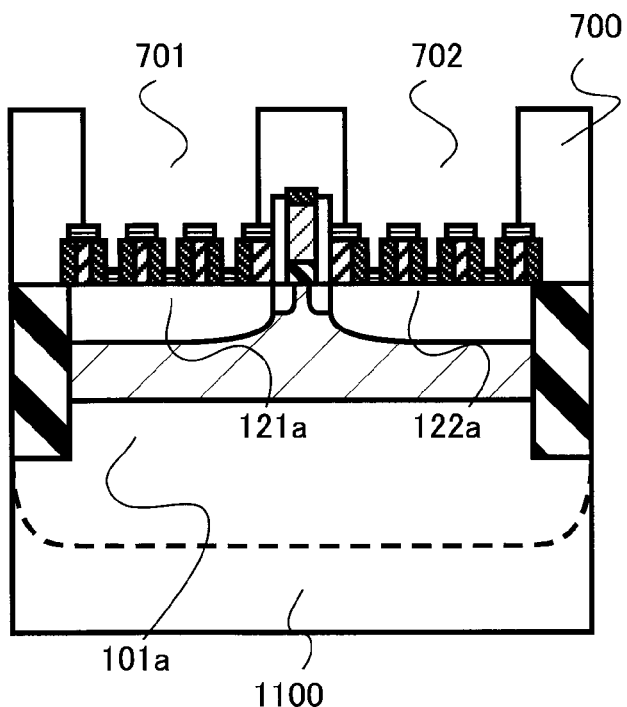
Figure 21B:
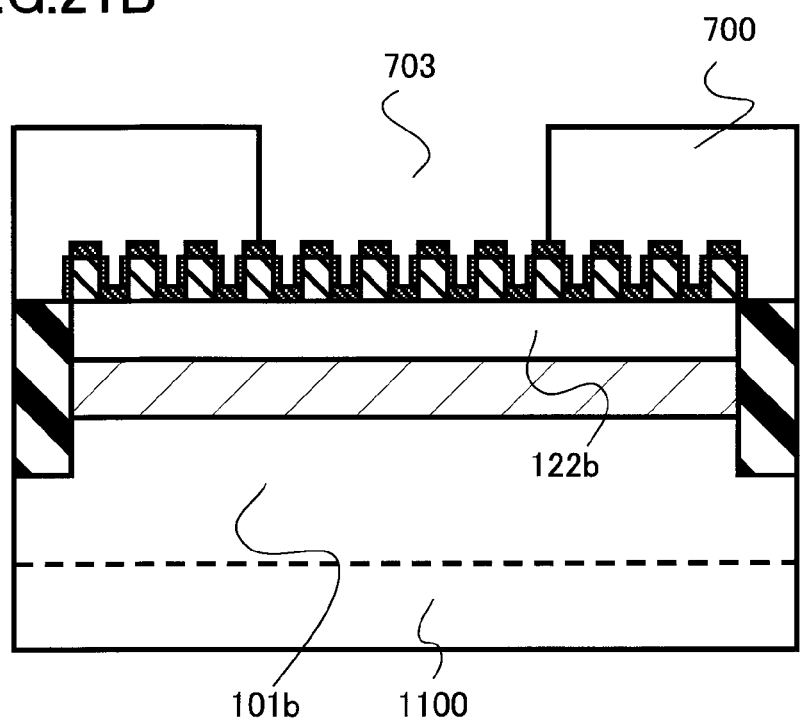

Subsequently, as shown in FIGS. 21A and 21B, contact holes 701-703 are drilled through the ILD film 700 down to the NiSi layers on the S/D regions by known techniques such as lithography and RIE.

Here, it is advisable that the RIE process for the contact hole formation should be done in two steps. The first step should be selective etching of the thick $SiO_x$ film against the thin SiN film. By doing so, the ensuing step can be specifically tuned for removal of the remaining thin SiN film in a short time etching to expose the underlying NiSi layers on the S/D regions. Since the second SiN RIE process can be completed in a very short time, unnecessary prolonged over-etching to the underlying NiSi layers can be dispensed with. Otherwise, without this SiN "etch-stopper", an excessive over-etching is indispensable in a single-step ILD etching, in order to make sure that the contact holes can be drilled through even in regions of thickest ILD and also to secure successful hole opening in the presence of ILD thickness variation (which should be proportional to the mean ILD thickness). Thus, by employing the two-step RIE process, excessive plasma damages to the bottoms of the contact holes can be avoided. Moreover, even if the contact bottom accidentally overlaps on the STI regions, this also prevents possible deep encroachment into the STI insulator due to extended over-etching. Furthermore, since the NiSi layers are singly-connected on each source or drain region, the contact holes are allowed to be loosely and roughly placed on the S/D regions without extra-precise position alignment. This is because, as far as the bottoms of the contact holes touch the singly-connected NiSi electrodes, electrical contacts to the entire S/D regions can be established through the NiSi electrodes. In addition, because the possible erosion of the STI insulator is prevented against accidental overlap of contact holes on the STI regions, portions of the contact holes are allowed to fall upon the STI regions. The above contact hole fabrication with a large process margin in its position alignment is commonly called as "borderless contact formation". Obviously, thus-attained simplification of device fabrication contributes greatly to reducing the manufacturing cost.

For successful borderless contact formation, the "etch-stopper" SiN film should be dense and uniform, covering conformaly over the exterior surfaces of fine structures on the substrate. A denser film is superior as an etch-stop layer. In addition, a denser film is a better barrier against extrinsic contamination. Of course, an uniform film is prerequisite for conformal coverage over the fine structures on the substrate. For such dense and uniform SiN film formation, the atomic layer deposition (ALD) technique using $Si_2Cl_6$ and $NH_3$ is preferable to the plasma-enhanced CVD (PECVD) method, even though the PECDV can form films at lower temperatures than ALD. It should be noted that, in the present invention, unlike conventional devices, thanks to the improved thermal stability of NiSi, the dense and uniform SiN film can be readily formed by ALD at a temperature of 500° C. or above, without suffering from substantial leakage generation.

Figure 22A:
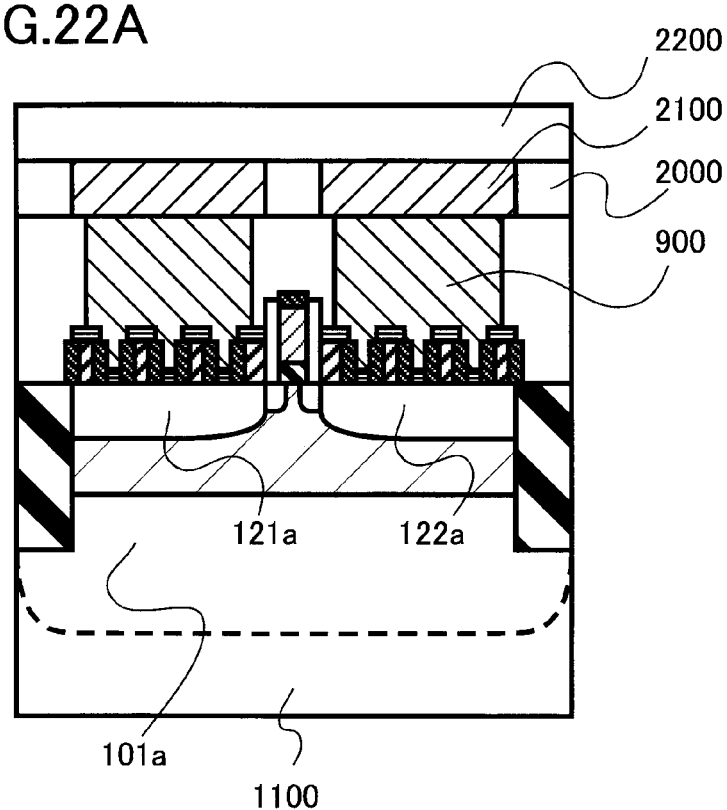
Figure 22B:
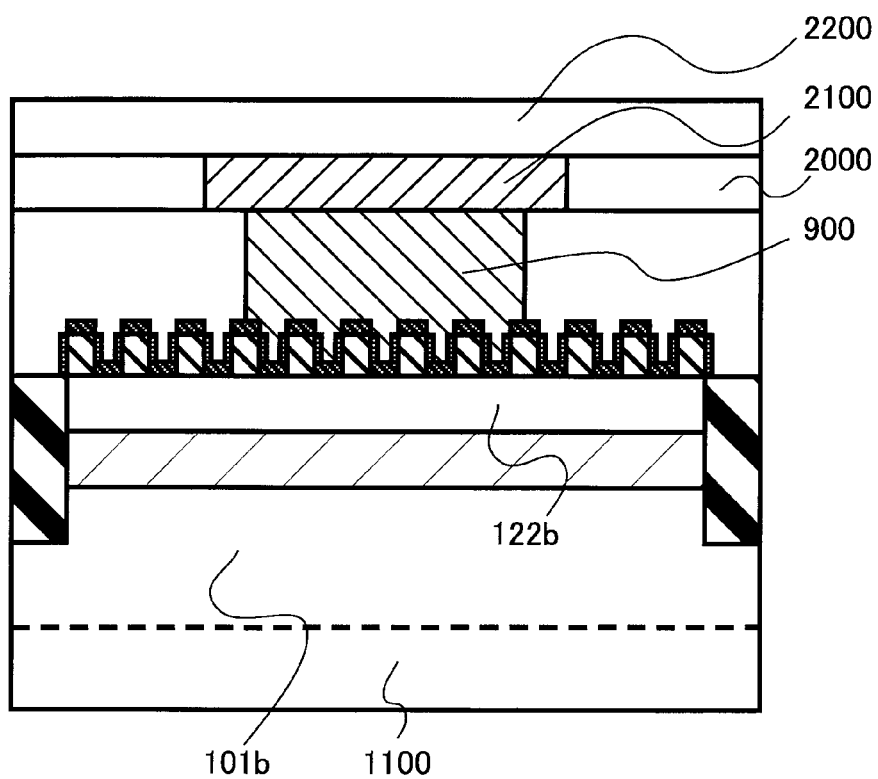

Next, the surfaces of NiSi regions exposed at the bottoms of the contact holes are cleaned by a plasma—e.g., $NF_3$-containing plasma—for a short time. Subsequently, as shown in FIGS. 22A-22B, wiring metal (i.e., via metal) layer 900 is made to fill up the contact holes. Thereafter, an ILD film 2000 of e.g., $SiO_x$ is deposited. Then, grooves are engraved therein by known techniques such as lithography and RIE. In these grooves, a metallic material, e.g., copper (Cu), is stuffed up by so-called damascene process to obtain a buried interconnection layer 2100. An insulative film 2200 of e.g., $SiO_x$ is further deposited over the interconnection layer as a passivation cover.

The wiring layer (i.e., via metal) 900 is typically made of e.g., a stack of titanium (Ti) and tungsten (W) films. Ti is used as interlayer between NiSi and W, since it blocks inter-mixing of NiSi and W. As explained below, Ti interlayer is also advantageous to establish sufficient electrical contacts with NiSi layers. The Ti may be sputter-deposited over the DSB substrate to a thickness of about 5 nm. Then, in order to secure electrical contacts with the underlying NiSi layer, annealing at 500° C. in nitrogen must be applied. By this annealing, a thin insulative oxide film (which forms unavoidably on the surfaces of NiSi layers) can be removed or "broken-down" by chemical reaction with Ti, thanks to the Ti's strong tendency to chemical reduction of oxide-like thin insulative material. As a result, good electrical contacts can be established between Ti and NiSi. Thereafter, W is deposited by CVD using gases of $WF_6$ and $H_2$.

In general, thermal processing at around 500° C. is indispensable to achieve good electrical contacts between the NiSi layers on the S/D regions and the wiring metals thereover. Annealing at lower temperature is insufficient to remove or break-down an ever-present oxide-like thin insulative material on the NiSi layers. On the other hand, without the thermal stabilization which is made available in this invention, in order to prevent unwanted Ni infiltration into Si substrate, the post-annealing temperature must be strictly limited well below 500° C. In other word, the contact resistance has to be compromised to avoid devastating leakage generation. The results are intolerable increase in contact resistance and poor production yields, thereby completely dashing initial intention of the silicide formation. Of course, with NiSi layers thus formed in accordance with the present embodiment, good electrical contacts through sufficient post-annealing can be obtained while, at the same time, maintaining leakage-free shallow S/D junctions without adverse short channel effects.

Finally, in order to complete the device fabrication, multi-layered interconnections may be further formed. In addition, assembly and packaging processes should be applied using known and effective techniques.

The semiconductor device as fabricated by the above-stated embodiment method has a CMOS structure including n-MOSFET and p-MOSFET. More specifically, on the DSB substrate which is composed of the first Si wafer with its surface of a Si{100} plane and the second Si wafer with its surface of a Si{110} plane directly bonded on the first Si wafer, the first Si region having the Si{100} plane and the second Si region having the Si{110} plane are provided. The n-MOSFET is formed in the first Si region whereas p-MOSFET is formed in the second Si region. Each MOSFET has its channel region, gate electrode overlying the channel region with a gate insulator film sandwiched therebetween, and a pair of laterally spaced-apart S/D regions being self-aligned with the gate electrode. Single-crystal Si layers are additionally formed over S/D regions, thereby constituting elevated source/drain (ESD) structures. In addition, parts of the single-crystal Si layers are arranged to extend over peripheral STI regions. On the Si surfaces having the Si{110} planes in S/D regions, more than two NiSi regions making up parts of the S/D regions of n-MOSFET and p-MOSFET are formed, each of the NiSi regions is of a rectangular planar shape having long sides normal to the Si<100> direction and short sides with width of $\leq 0.5$ μm in parallel with this Si<100> direction. In the n-MOSFET, the Si substrate surface has the Si{100} plane. Directly over its S/D regions, the NiSi regions are formed only on the sidewalls of grooves having the Si{110} plane. In the p-MOSFET, the Si substrate surface has the Si{110} plane. Directly over its S/D regions, the NiSi regions are formed only on the Si{110} sidewalls, the Si{110} bottom faces, and the Si{110} top surfaces of the grooves.

Also importantly, the crystal grains constituting the NiSi layers along the Si<110> edges align their NiSi<411> directions towards the Si<100> direction, so that either smaller angles formed by the NiSi<411> directions and the Si<100> direction are within twenty (20) degrees. Moreover, in each source or drain region, the NiSi layers are made to be singly-connected.

As explained in detail above, the semiconductor device of the present embodiment offers several advantages that follow:

(a) By forming respective channel regions on the optimum crystal planes depending on its conductivity type, carrier mobilities of both n-MOSFET and p-MOSFET can be maximized at once.

(b) Directly over the S/D regions, the rectangular NiSi layers are formed only on Si{110} planes with their widths across Si<100> directions being kept less than 0.5 μm. Moreover, at the edges along the Si<110> directions, the NiSi<411> directions of constituent NiSi grains are aligned towards Si<100>, so that the NiSi grains are terminated by thermally stable NiSi{411} planes. Accordingly, junction leakage from the NiSi layers can be effectively suppressed.

(c) With the elevated source drain structure and associated shallow S/D junctions, the short channel effects can be reduced, allowing aggressive scaling-down of MOSFETs.

(d) In each source or drain region, NiSi layers are made to be singly-connected, assuring a low electrical resistance of S/D electrodes to enhance the drivability of the MOSFETs.

(e) Since portions of S/D electrodes are brought over the STI regions, in effect, their capacitive coupling to the substrate is reduced, thus enhancing operation speed of the MOSFETs.

The manufacturing method of the present embodiment also offers effects and advantages which follow:

(1) It is possible to fabricate by simplified processes the semiconductor device having the ESD-CMOSFET structure with silicided shallow S/D diffusion layers while securing good electrical contacts with wiring metals thanks to the improved thermal stability of NiSi regions.

(2) By setting the pitch of the groove arrays smaller than the groove depth, in each n-MOSFET S/D region, the total contact area between the singly-connected NiSi electrode and the Si material can exceed the horizontally-projected planer area-size of the S/D region. Therefore, the overall contact resistance of the singly-connected NiSi electrode to the S/D region can be reduced compared with a silicide layer in a conventional elevated-S/D-MOSFET structure.

(3) Because the NiSi layers are singly-connected on each source or drain region, the contact holes are allowed to be loosely placed on the S/D regions without extra-precise position alignment as far as the bottoms of the contact holes touch the singly-connected NiSi electrodes, thereby contributing to manufacturing cost reduction by process simplification.

(4) Thanks to the improved thermal stability of NiSi made available in the present invention, a dense and uniform SiN film, indispensable for good barrier as well as excellent etch-stop ability, can be formed at a temperature of 500° C. or above, without suffering from substantial leakage generation.

(5) The tilted carbon ion implantation enabled the cost-saving one-stroke easy exposure of the fine line-shaped Si{110} planes along the Si<110> direction in S/D regions of both n-MOSFET and p-MOSFET over the DSB substrate without resort to costly processes like lithography.

While this embodiment has been described using one exemplary CMOS structure having a pair of MOSFETs, it will readily occur to those skilled in the art that the device features and the fabrication technique stated above may also be applicable to more than two pairs of FETs or to a group of FETs making up part of a semiconductor device.

Additionally, the principles of this invention may alternatively be applied to semiconductor devices having either one type of the n-MOSFET and p-MOSFET, rather than both of them, and also to a fabrication method thereof.

Although the embodiment device is arranged to have the n-MOSFET with Si{100} plane channel region and p-MOSFET with Si{110} plane channel region for maximization of the carrier mobility, this channel plane setting should not be construed as limiting the invention. When the need arises, the channel planes may be set vice versa—that is, the p-MOSFET has a channel region with its surface identical to the Si{100} plane whereas n-MOSFET channel region has the Si{110} surface.

Although, in the embodiment, the gate electrode is partly silicided at its upper part, this gate electrode can be completely silicided if necessary, thereby to provide the so-called fully silicided (FUSI) gate structure. In this case also, similar advantages are retained.

While, in the embodiment, the MOSFETs with SiO$_x$ gate insulator film are employed, the principles of this invention may be widely applicable to MISFETs with a gate insulator film made of other similar suitable insulative materials.

Instead of the DSB substrate used in the embodiment device, alternatively, a silicon-on-insulator (SOI) substrate having hybrid surfaces composed of different crystal orientations can be used.

Second Embodiment

The second embodiment making use of the above-explained principle of the present invention provides a silicided p-MOSFET formed on a Si{110} substrate without ESD structure.

Figure 23:
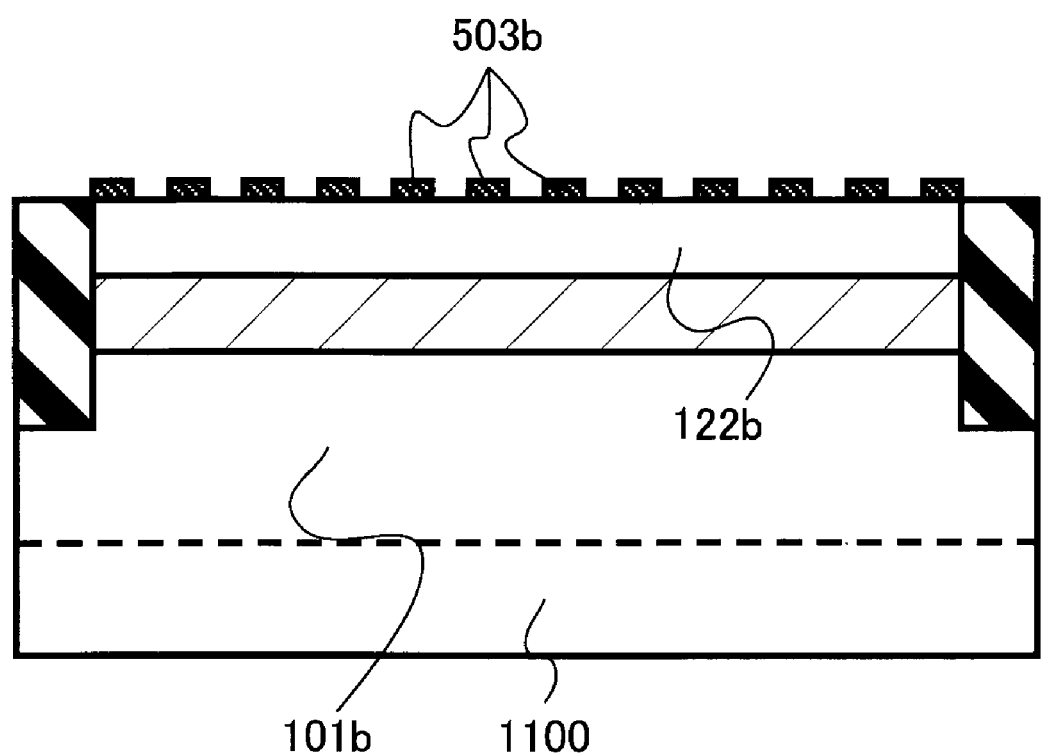
FIG. 23 depicts, in cross-section, a major part of a semiconductor device in accordance with second embodiment of the invention.

FIG. 23 shows a cross sectional view of the p-MOSFET at its S/D regions along the gate direction at one stage of its fabrication. As shown in the figure, stripes of NiSi layers 503b extending along the Si<110> direction are directly formed on the Si{110} surfaces of the S/D regions. These NiSi stripes can be obtained by sputter-depositing Ni film over the S/D regions, then patterning it into fine-lines by e.g., lithography and RIE techniques, and finally annealing the patterned Ni film to form NiSi. Here, the width across Si<100> of each fine-line NiSi layer should be kept below ≦0.5 µm as in the first embodiment. Alternatively, the structure may be obtained by delineating fine line-shaped active regions by STI regions prior to the sputter-deposition of Ni. In this case, a cross-sectional view corresponding to FIG. 23 should contain STI regions partitioning the S/D diffusions regions.

Since NiSi layers are formed on Si{110} surfaces of the S/D regions with their widths across Si<100> being kept less than 0.5 µm, junction leakage from the NiSi layers can be effectively suppressed as in the first embodiment. In addition, because the device fabrication of this embodiment dispenses with the additional single-crystal Si layer formation and the groove carving, it provides a simpler way of forming MOSFETs with leakage-free shallow S/D junctions.

Although the p-MOSFET is singled out for exemplification, the above-stated device structure and the fabrication method thereof may also be applied to an n-MOSFET when it is to be formed on the Si{110} surface.

Needless to say, as far as the NiSi layers are to be formed on Si{110} planes, the present embodiment can also be directly applied to ESD-structured MOSFETs with additional Si{110}-surfaced single-crystal Si layers on the S/D regions.

Third Embodiment

Figure 24:
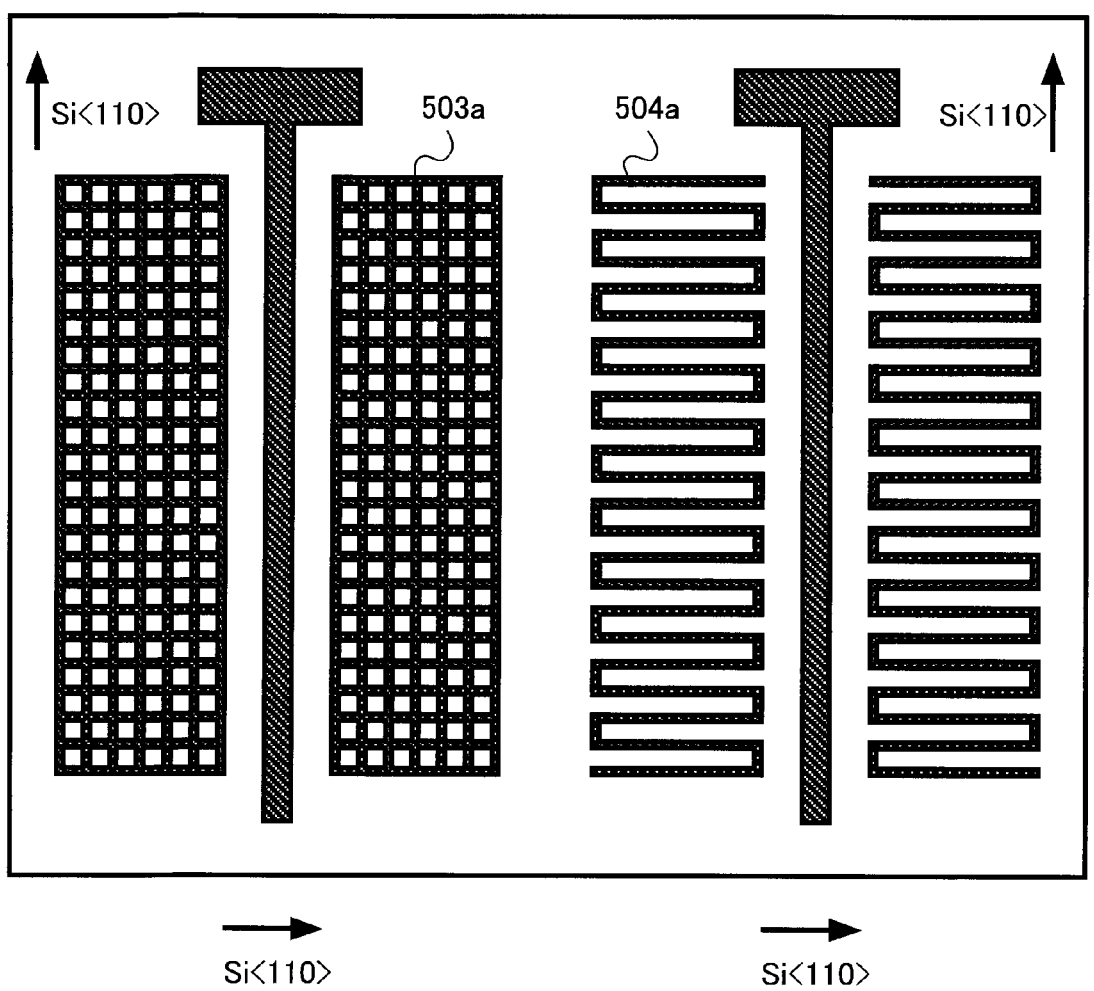
FIG. 24 is a plan view of a semiconductor device in accordance with third embodiment of the invention.

The third embodiment making use of the above-explained principle of the present invention provides silicided MOSFETs formed on a Si{100} substrate. FIG. 24 shows a plan view of the n-MOSFETs with nickel silicide (NiSi) layers forming a crisscross grid pattern 503a or a winding serpentine pattern 504a on its S/D regions.

The devices shown in FIG. 24 can be fabricated by engraving grid-shaped or serpentine-shaped grooves in the S/D regions. Subsequent NiSi formation only on the sidewalls of the grooves completes the device structure shown in the figure.

It should be note that, on the Si{100} substrate, Si{110} planes can form orthogonal sidewalls. Therefore, a rectangular groove can be made to have only Si{110} sidewalls. For that matter, as far as their sidewalls are all made up of orthogonal Si{110} planes, even non-rectangular shaped grooves, as those in the present embodiment, can have leakage-free NiSi layers on their sidewalls, provided that the groove depths are shallower than 0.5 µm. Obviously, the present embodiment is equally applicable to both p-MOSFETs and n-MOSFETs when they are to be formed on the Si{100} surface.

Since more densely patterned NiSi electrodes are deployed over the S/D regions in the present embodiment, electrical resistances of the S/D regions can be reduced yet further compared to those attainable with the slit-shaped NiSi layers of the first embodiment. Thus, it is possible to fabricate a MOSFET with leakage-free, shallow and very low resistance silicided S/D junctions.

Fourth Embodiment

Figure 25:
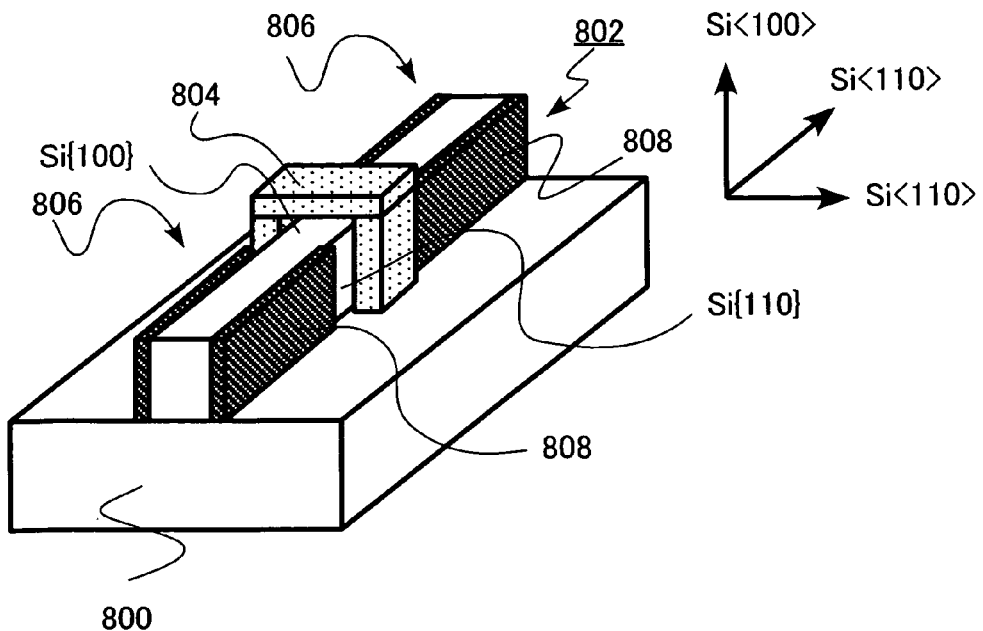
FIG. 25 and FIG. 26 are perspective views of major parts of semiconductor devices in accordance with fourth embodiment of the invention.

The fourth embodiment making use of the above-explained principle of the present invention provides a p-MOSFET with the so-called Fin-FET structure, whose gate electrode is straddling over a thin single-crystal Si plate, protruding vertically from a Si substrate like a fin. As shown in FIG. 25 as a perspective view, the Fin-FET has a gate electrode 804 straddling, via a gate insulator, over the center part of a fin-shaped single-crystal silicon layer 802 on a silicon substrate 800. The both parts of the fin 806, thus-divided by the gate electrode 804, serves as S/D regions. The center part of the fin thus-sandwiched by the gate electrode 804 serves as a channel region. The both major sidewalls of the fin (over which the gate electrode is formed) are made of Si{110} planes and the channel current direction is set to be Si<110>. The height and width of the fin are both set to be less than or equal to 0.5 µm.

The leakage-free NiSi layers 808 can be formed on any Si{110} sidewalls of the S/D regions, but excluding the fin's Si{100} top surfaces of the S/D regions. Since the height of the fin is less than or equal to 0.5 µm, the NiSi layer's widths across Si<100> direction don't exceed 0.5 µm. Therefore, Ni migration into the channel region and associated agglomeration (i.e., morphological degradation) of NiSi layers can be prevented even during annealing above 500° C. At the same time, the Fin-FET as described in this embodiment is quite immune against the short-channel effects.

Thus, it becomes possible to obtain highly miniaturized MOSFETs with very low leakage currents. It should be also mentioned here, although not depicted, in the actual application, a plurality of the Fin-FET may be laterally connected in parallel at the both ends of the S/D regions to form a single MOSFET.

Figure 26:
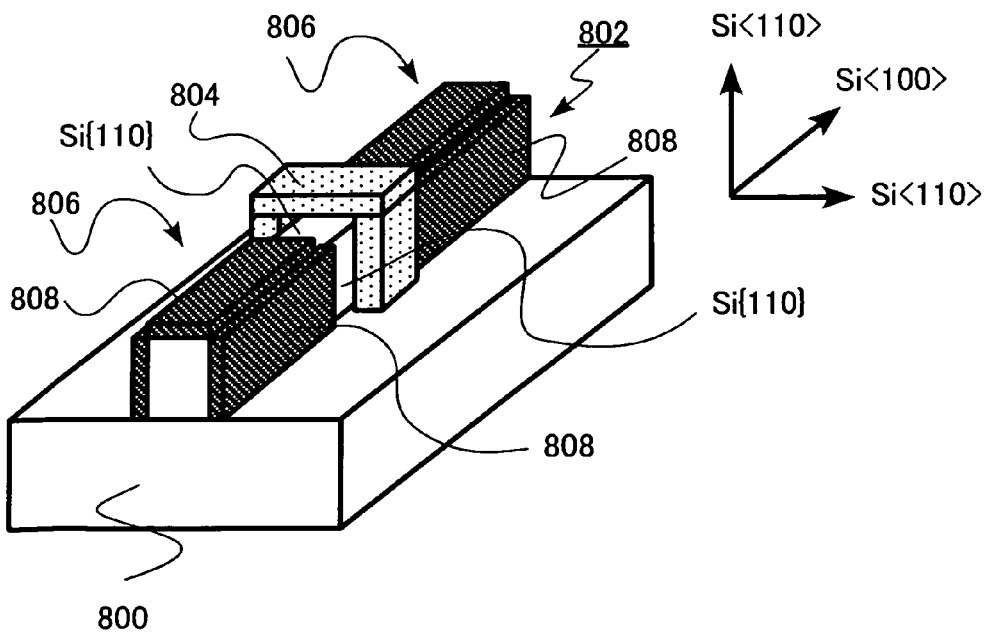

Besides the above fin, whose top surface is a Si{100} plane, a fin with a Si{110} top surface can also be used as shown in FIG. 26. In this case, the major sidewalls of the fin should remain to be Si{110} whereas the channel direction is set to be Si<100>.

The leakage-free NiSi layers can be formed not only on the Si{110} major sidewalls but also on the Si{110} top surfaces of the S/D regions, provided their lengths along Si<100> are less than or equal to 0.5 µm.

Although, the p-MOSFET is singled out to exemplify the present embodiment in consideration for the merits to the hole mobility on the Si{110} plane, the benefits of NiSi thermal stabilization and leakage suppression are also available for a Fin-n-MOSFET as well.

Fifth Embodiment

Figure 27:
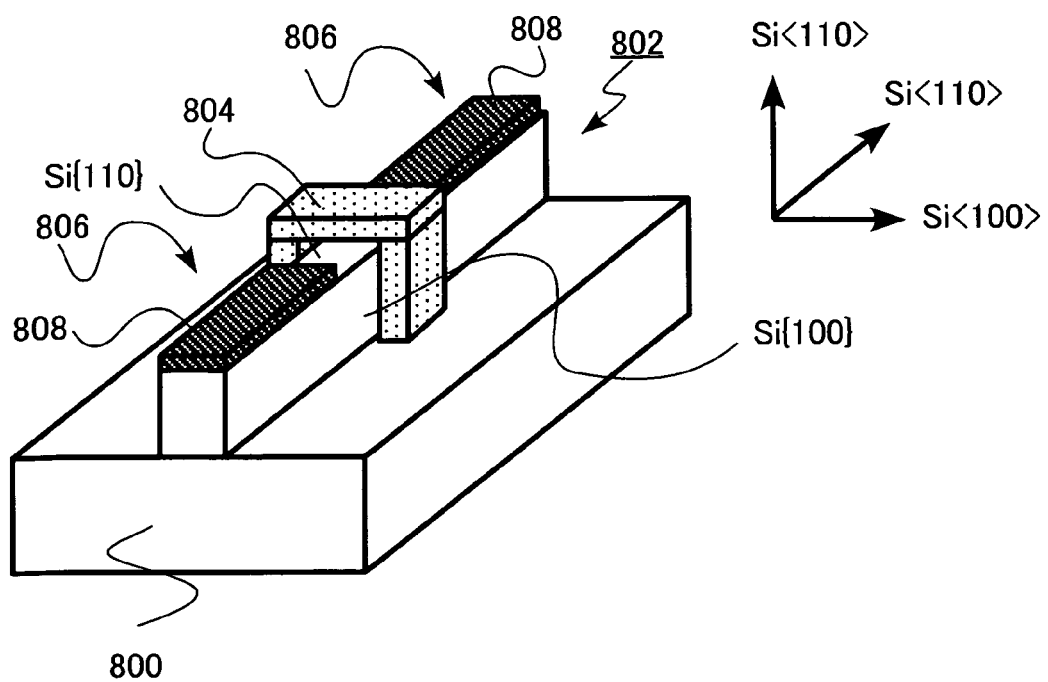
FIG. 27 is a perspective view of a major part of semiconductor device in accordance with fifth embodiment of the invention.

The fifth embodiment making use of the above-explained principle of the present invention provides a Fin-n-MOSFET formed on a single-crystal fin whose major sidewalls are made of Si{100} planes. As shown in FIG. 27 as a perspective view, the fin has Si{100} major sidewalls and a Si{110} top surface. The channel direction is set to be Si<110>. The height and width of the fin are both set to be less than or equal to 0.5 µm.

The leakage-free NiSi layers 808 should be formed on the Si{110} top surfaces of the respective S/D regions, but excluding the Si{100} major sidewalls of the S/D regions. Since the width of the fin is less than or equal to 0.5 µm, the NiSi layer's widths across Si<100> direction don't exceed 0.5 µm. Therefore, Ni migration into the channel region and associated agglomeration (i.e., morphological degradation) of NiSi layers can be prevented even during annealing above 500° C.

At the same time, the Fin-FET as described in this embodiment is quite immune against the short-channel effects. Thus, it becomes possible to obtain highly miniaturized MOSFETs with very low leakage currents.

It should be also mentioned here, although not depicted, in the actual application, a plurality of the Fin-FET may be connected in parallel at the both ends of the S/D regions to form a single MOSFET.

Although, the n-MOSFET is singled out to exemplify the present embodiment in consideration for the merits to the electron mobility on the Si{100} plane, the benefits of NiSi thermal stabilization and leakage suppression are also available for a Fin-p-MOSFET as well.

Although the invention has been disclosed and illustrated above with reference to particular embodiments, the principles involved are susceptible for use in numerous other embodiments, modification and alterations which will be apparent to persons skilled in the art to which the invention pertains. As for those components or processes deemed not relevant directly to the principles of the invention are not specifically set forth in the description, these may be readily implemented by technicians in the semiconductor device art without requiring any inventive activities on a case-by-case basis.

Additionally, semiconductor devices and fabrication methods which comprise the subject matter of this invention and which are design-modifiable by those skilled in the art are interpreted to be included within the coverage of this invention. The invention is, therefore, to be limited only as indicated by the scope of the appended claims.

What is claimed is:

1. A semiconductor device having a MISFET, comprising:
   a silicon substrate;
   a channel region of said MISFET in said silicon substrate;
   a gate insulating film on said channel region;
   a gate electrode overlying said channel region with said gate insulating film being sandwiched therebetween;
   a pair of spaced-apart source and drain regions interposing said channel region therebetween; and
   a plurality of nickel silicide regions making up part of said source and drain regions of said MISFET, said nickel silicide regions being provided on silicon surfaces having Si{110} crystal planes in said source and drain regions, and the each nickel silicide region containing a rectangular planar shape having long sides laying perpendicular to a Si<100> direction on said silicon surface and short sides being parallel to the Si<100> direction and having a width of 0.5 µm or less.

2. The device according to claim 1, wherein said each nickel silicide region is made of crystals whose NiSi<411> orientations are aligned towards the Si<100> direction along said long sides, so that smaller angles formed between the NiSi<411> and the Si<100> are made twenty (20) degrees or less.

3. The device according to claim 1, wherein a surface of said silicon substrate has a {100} plane and wherein said nickel silicide regions are formed only on sidewalls of grooves defined in said silicon substrate, all of said sidewalls being made up of the Si{110} planes.

4. The device according to claim 1, wherein a surface of said silicon substrate has the {110} plane and wherein said nickel silicide regions are formed on said silicon surfaces which are parallel to said silicon substrate surface.

5. The device according to claim 1, wherein a surface of said silicon substrate has the {110} plane, wherein said silicon substrate has grooves defined therein to have first sidewalls with the Si{110} planes and second sidewalls with Si{100} planes and a bottom surface with the Si{110} plane, and wherein said nickel silicide regions are formed only on said first sidewalls and said bottom surface of said grooves.

6. The device according to claim 1, further comprising:
   single-crystalline silicon layers on said silicon substrate at both sides of said gate electrode, said nickel silicide regions being formed on said single-crystalline silicon layers.

7. The device according to claim 1, wherein said nickel silicide regions are electrically connected together.

8. The device according to claim 1, wherein the device has an n-channel type MISFET and a p-channel type MISFET, wherein said silicon substrate is a DSB substrate having a direct bonding of a first silicon wafer having a {100} plane and a second silicon wafer having the {110} plane, said DSB substrate having a surface in which a first silicon region having the Si{100} plane and a second silicon region having the Si{110} plane are provided, and wherein said n-channel type MISFET is formed in said first silicon region whereas said p-channel type MISFET is formed in said second silicon region.

9. A semiconductor device having a fin type MISFET ("Fin MISFET"), comprising:
   a silicon substrate;
   a thin plate-shaped fin type single-crystalline silicon layer formed on said substrate;
   a channel region of said MISFET in said silicon layer;
   a gate insulating film on said channel region;
   a gate electrode overlying said channel region with said gate insulating film being sandwiched therebetween;
   a pair of spaced-apart source and drain regions interposing said channel region therebetween; and
   a plurality of nickel silicide regions making up part of said source and drain regions of said MISFET, said nickel silicide regions being provided on silicon surfaces having Si{110} crystal planes in said source and drain regions, and the each nickel silicide region containing a rectangular planar shape having long sides laying perpendicular to a Si<100> direction on said silicon surface and short sides being parallel to the Si<100> direction and having a width of 0.5 μm or less.

10. The device according to claim 9, wherein a channel direction of said MISFET is set to a Si<110> direction, wherein sidewalls of said silicon layer include the Si{110} planes, and wherein said silicon surfaces are parts of said sidewalls.

11. The device according to claim 9, wherein a channel direction of said MISFET is set to a Si<110> direction, wherein sidewalls of said silicon layer include Si{100} planes.

* * * * *